United States Patent
Chaves et al.

(10) Patent No.: US 7,755,838 B2
(45) Date of Patent: Jul. 13, 2010

(54) OPTICAL DEVICES

(75) Inventors: Julio C. Chaves, Santa Ana, CA (US); Waqidi Falicoff, Newport Beach, CA (US); Juan C. Miñano, Madrid (ES); Pablo Benitez, Madrid (ES); Oliver Dross, Madrid (ES); William A. Parkyn, Jr., Lomita, CA (US)

(73) Assignee: Light Prescriptions Innovators, LLC, Altadena, CA (US)

( * ) Notice: Subject to any disclaimer, the term of this patent is extended or adjusted under 35 U.S.C. 154(b) by 51 days.

(21) Appl. No.: 11/890,601

(22) Filed: Aug. 6, 2007

(65) Prior Publication Data
US 2008/0170296 A1 Jul. 17, 2008

Related U.S. Application Data

(62) Division of application No. 11/115,055, filed on Apr. 25, 2005, now Pat. No. 7,286,296.

(60) Provisional application No. 60/564,847, filed on Apr. 23, 2004, provisional application No. 60/612,558, filed on Sep. 22, 2004, provisional application No. 60/614,565, filed on Sep. 29, 2004, provisional application No. 60/658,713, filed on Mar. 3, 2005.

(51) Int. Cl.
*G02B 27/14* (2006.01)
*G02B 13/18* (2006.01)
*G02B 3/02* (2006.01)

(52) U.S. Cl. ..................... 359/636; 359/708

(58) Field of Classification Search ......... 359/636–638, 359/707, 712, 726–727; 362/555, 341, 347
See application file for complete search history.

(56) References Cited

U.S. PATENT DOCUMENTS

| 3,739,217 | A | 6/1973 | Bergh et al. .............. 313/108 |
| 3,957,031 | A | 5/1976 | Winston .................. 126/270 |
| 4,002,499 | A | 1/1977 | Winston .................. 136/206 |
| 4,362,361 | A | 12/1982 | Campbell et al. ......... 350/171 |

(Continued)

FOREIGN PATENT DOCUMENTS

EP 1 160 883 A2 5/2001

(Continued)

OTHER PUBLICATIONS

R.B. Miles, S.G. Webb, and E.L. Griffith, Hemispherical-Field-of-View, Nonimaging Narrow-Bank Spectral Filter, *Optical Society of America*, vol. 6, No. 12-Dec. 1981. pp. 616-618.

*Primary Examiner*—Alicia M Harrington
(74) *Attorney, Agent, or Firm*—Drinker Biddle & Reath LLP

(57) ABSTRACT

An optical manifold for efficiently combining a plurality of blue LED outputs to illuminate a phosphor for a single, substantially homogeneous output, in a small, cost-effective package. Embodiments are disclosed that use a single or multiple LEDs and a remote phosphor, and an intermediate wavelength-selective filter arranged so that backscattered photoluminescence is recycled to boost the luminance and flux of the output aperture. A further aperture mask is used to boost phosphor luminance with only modest loss of luminosity. Alternative non-recycling embodiments provide blue and yellow light in collimated beams, either separately or combined into white.

15 Claims, 20 Drawing Sheets

U.S. PATENT DOCUMENTS

| | | | |
|---|---|---|---|
| 5,084,804 A * | 1/1992 | Schairer | 362/459 |
| 5,813,753 A | 9/1998 | Vriens et al. | 362/293 |
| 6,155,699 A | 12/2000 | Miller et al. | 362/293 |
| 6,186,650 B1 | 2/2001 | Hulse et al. | 362/511 |
| 6,350,041 B1 | 2/2002 | Tarsa et al. | 362/231 |
| 6,549,710 B2 | 4/2003 | Simmons et al. | 385/121 |
| 6,556,754 B2 | 4/2003 | Simmons et al. | 385/121 |
| 6,655,848 B2 | 12/2003 | Simmons et al. | 385/56 |
| 0,150,997 A1 | 8/2004 | Ouderkirk et al. | 362/255 |
| 6,784,462 B2 | 8/2004 | Schubert | 257/98 |
| 6,819,687 B1 | 11/2004 | Fein | 372/6 |
| 6,832,032 B2 | 12/2004 | Simmons et al. | 385/121 |
| 6,847,774 B2 | 1/2005 | Simmons et al. | 385/134 |
| 6,850,684 B2 | 2/2005 | Simmons et al. | 385/134 |
| 6,869,206 B2 | 3/2005 | Zimmerman et al. | 362/310 |
| 7,080,932 B2 | 7/2006 | Keuper | 362/613 |
| 7,144,131 B2 | 12/2006 | Rains | 362/231 |
| 7,255,469 B2 | 8/2007 | Wheatley et al. | 362/609 |
| 7,286,296 B2 | 10/2007 | Chaves et al. | 359/641 |
| 2003/0095399 A1 * | 5/2003 | Grenda et al. | 362/30 |
| 2004/0145308 A1 | 7/2004 | Rossner et al. | 313/512 |
| 2004/0174696 A1 | 9/2004 | Buelow, II et al. | 362/84 |
| 2005/0105301 A1 | 5/2005 | Takeda et al. | 362/545 |
| 2005/0117361 A1 | 6/2005 | Takeda et al. | 362/509 |
| 2005/0219476 A1 * | 10/2005 | Beeson et al. | 353/98 |
| 2005/0243570 A1 | 11/2005 | Chaves et al. | 362/551 |
| 2005/0269582 A1 | 12/2005 | Mueller et al. | 257/94 |
| 2006/0002101 A1 | 1/2006 | Wheatley et al. | 362/84 |

FOREIGN PATENT DOCUMENTS

| | | |
|---|---|---|
| GB | 2 365 962 A | 7/2001 |
| WO | 01/40702 | 11/2000 |
| WO | 2004/021461 A2 | 8/2003 |

* cited by examiner

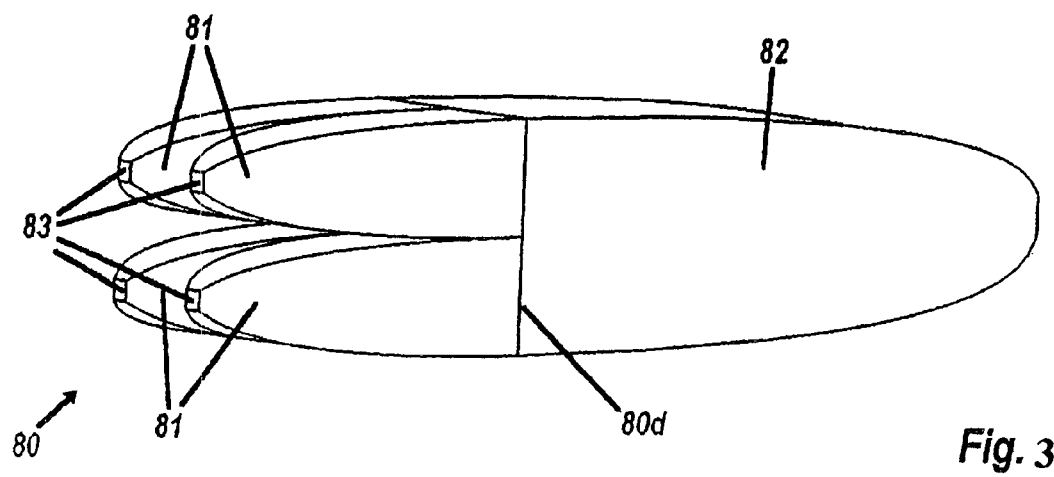
*Fig.* 3A
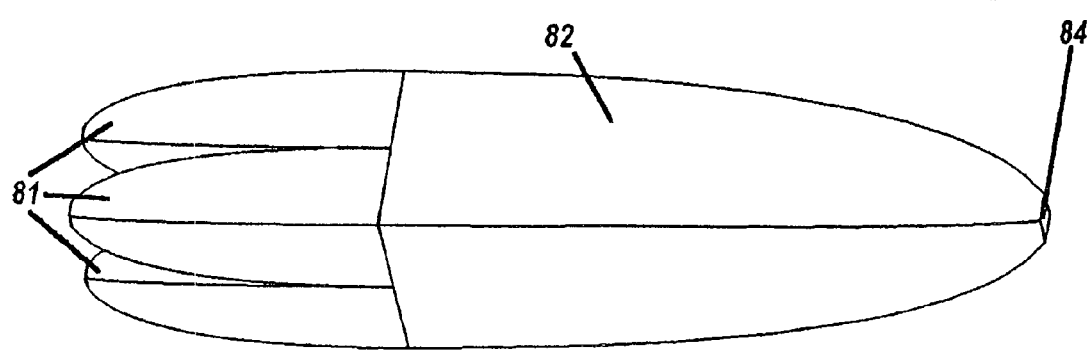
*Fig.* 3B
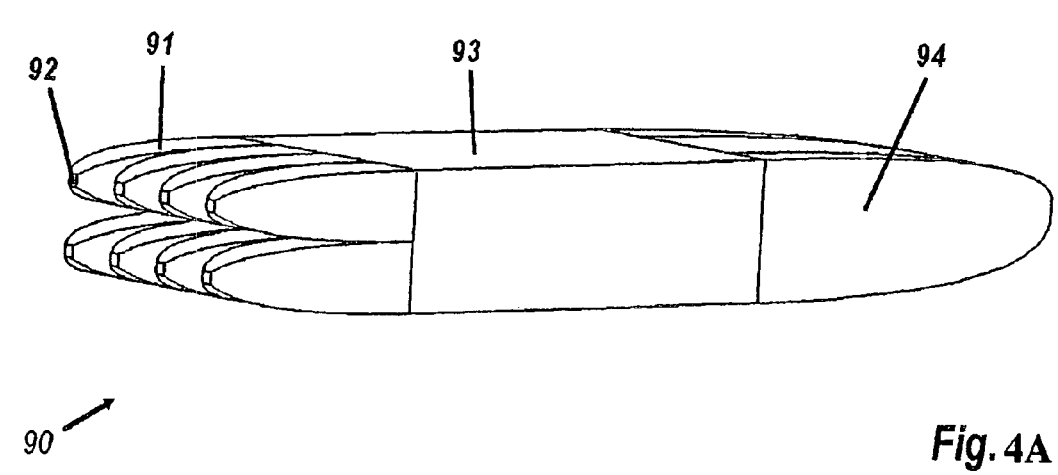
*Fig.* 4A

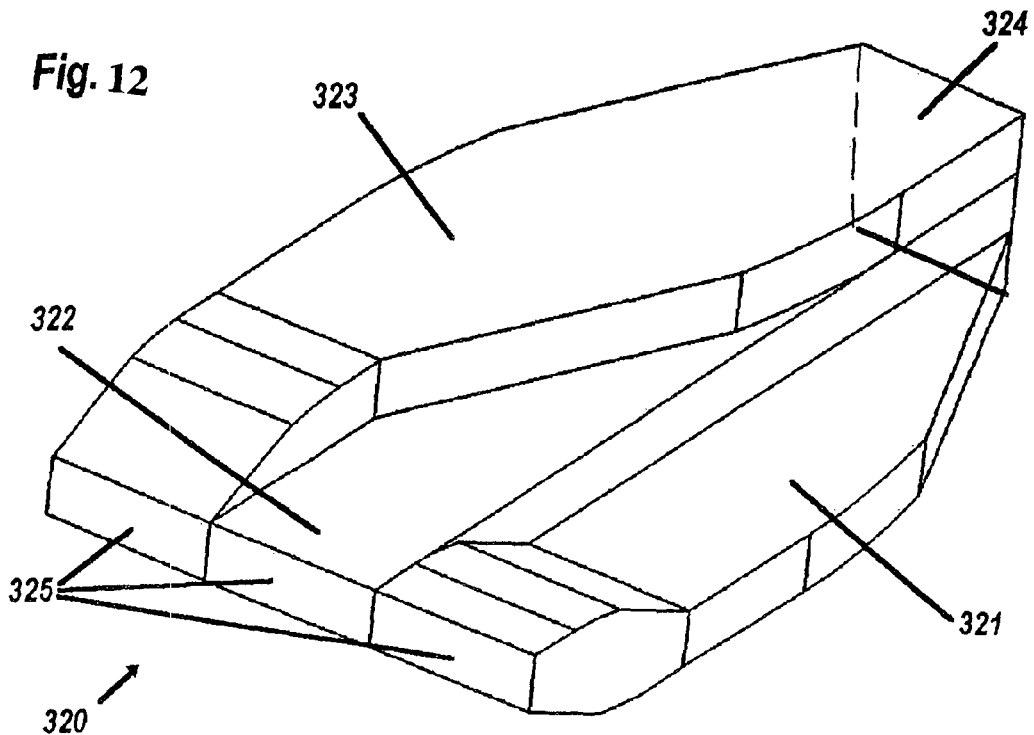
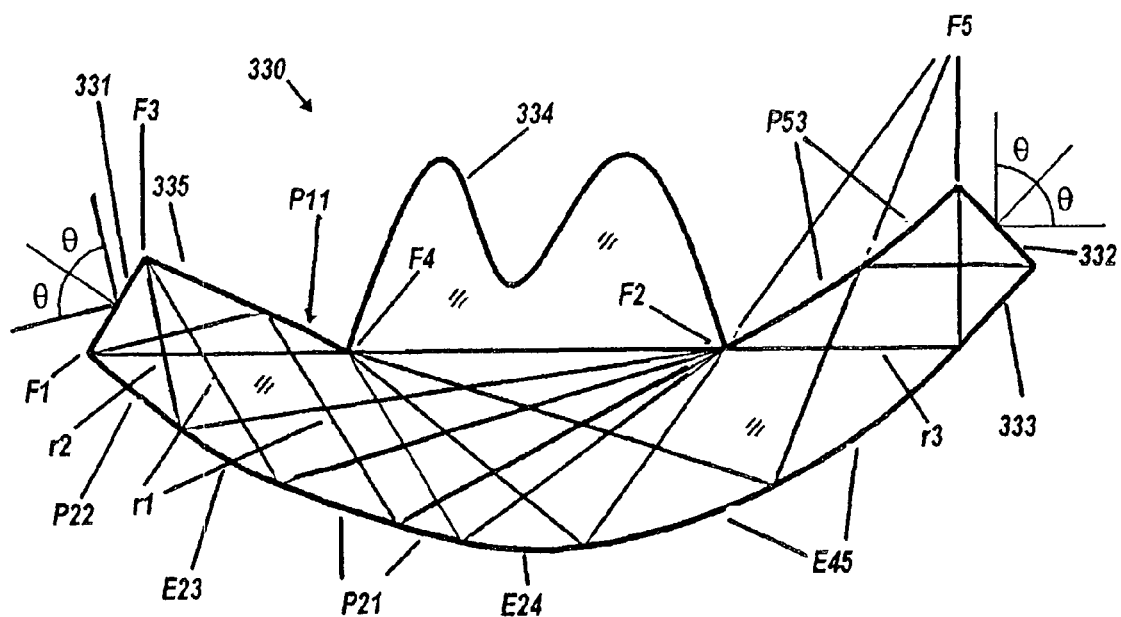

OPTICAL DEVICES

CROSS REFERENCE TO RELATED APPLICATIONS

This application is a continuation of U.S. patent application Ser. No. 11/115,055 for "OPTICAL MANIFOLD FOR LIGHT-EMITTING DIODES" of Chaves et al. filed Apr. 25, 2005, the disclosure of which is incorporated herein by reference in its entirety.

Application Ser. No. 11/115,055 claims the benefit of U.S. Provisional Patent Application No. 60/658,713, filed Mar. 3, 2005, entitled OPTICAL MANIFOLDS FOR LIGHT-EMITTING, DIODES, which is incorporated by reference herein in its entirety.

Application Ser. No. 11/115,055 claims the benefit of U.S. Provisional Patent Application No. 60/614,565, filed Sep. 29, 2004, entitled OPTICAL MANIFOLDS FOR LIGHT-EMITTING DIODES, which is incorporated by reference herein in its entirety.

Application Ser. No. 11/115,055 claims the benefit of U.S. Provisional Patent Application No. 60/612,558, filed Sep. 22, 2004, entitled OPTICAL MANIFOLDS FOR LIGHT-EMITTING DIODES, which is incorporated by reference herein in its entirety.

Application Ser. No. 11/115,055 claims the benefit of U.S. Provisional Patent Application No. 60/564,847, filed Apr. 23, 2004, entitled OPTICAL MANIFOLDS FOR LIGHT-EMITTING DIODES, which is incorporated by reference herein in its entirety.

STATEMENT REGARDING FEDERALLY FUNDED RESEARCH AND DEVELOPMENT

This invention was supported in part by the National Energy Technology Laboratory Award No. DE-FC26-05NT42341. The Government may have certain rights in this invention.

BACKGROUND OF THE INVENTION

1. Field of the Invention

The present invention relates generally to light-emitting diodes (LEDs), and more particularly to light collection/distribution systems that utilize one or more LEDs.

2. Description of Related Art

Light emitting diodes (LEDs) are a widely available, inexpensive, and efficient light source. For low light uses such as camping headlamps, one or two LEDs provide adequate light. However, to utilize LEDs for applications that require more light, such as automobile headlamps, it is necessary to combine the outputs of a plurality of LEDs. The LED prior art is less than satisfactory regarding the combination of the luminous outputs of a plurality of emitter-chips. Physical chip-adjacency can indeed produce a larger light source, but heat-removal limitations reduce the total luminance. Also, there is little continuity of illuminance between the adjacent emitters, leaving dark zones between the individual emitters. LEDs are available from a wide variety of suppliers, and in commercially available LEDs the emitters themselves have pronounced variations in luminance. For example, some suppliers (e.g., the OSRAM Corporation of San Jose, Calif. and the Cree Corporation of Santa Barbara, Calif.) manufacture high-power LEDs with wires and bonding pads that block light from the top of the emitting chip. In contrast, high-power LEDs from the Lumileds Corporation of San Jose, Calif. exemplify flip-chips, which have no wires or bonds that would otherwise block light emission in front. Even these, however, show great luminance variations across the emitter. The Luxeon I and Luxeon III LEDs by Lumileds, for example, can vary in luminance by a factor of ten from center to edge, with random patterns in between that differ from one chip to the next. Such undesirable patterning, whether on flip-chips or front-wired chips, can cause detrimental artifacts in the beams of collimating or condensing lenses. Although diffusers can be placed over such lenses, diffusers lose 15% of the light and give the beam a fuzzy edge. A more efficient method of source homogenizing, one that preserves sharp edges, would be a significant advance in illumination optics. Although thin-film LEDs have greatly improved uniformity over conventional on-substrate LEDs, there are fundamental reasons why they will always have nonuniform illuminance, because of inherently nonuniform current distribution downward through the active, light-generating layer. Using larger soldered electrodes causes more useless surface recombination at their juncture with the LED, so that electrodes must be kept small. In contrast, the optical transformer described herein places a premium on a corner location for the current-feed, amplifying the nonuniformity. Because the untreated sawed edges of the LED chip will cause surface recombination, current cannot be allowed to reach them, so that the LED cannot be illuminated all the way to its edge. It would be an advantage to provide an optical transformer that alleviates luminance inhomogeneities inherent to LEDs.

Beyond making a single source uniform, a better optical method is needed for combining the outputs of spatially separate LED chips, which are easier to cool than when closely packed. Such an optical source-combination device should optimally produce a uniform luminance with sharp edges. Besides easier thermal management, optical source-combination is needed that makes unnoticeable the individual variations or even failures of any of the LEDs.

The LED prior art is also less than satisfactory regarding the geometry of phosphor utilization in LEDs, such as for LEDs that generate white light. A phosphor coating of a quarter-millimeter (250 microns) or more directly onto a one-mm blue chip will necessarily increase source area, sometimes by a factor of four, and thus reduce luminance. The application of phosphor to such small chips necessarily results in color-temperature variations across each chip and between them as well. Also, much of the phosphor output backscatters; that is, it shines wastefully back into the chip, which is relatively absorptive. Finally, the phosphor must withstand the chip's high operating temperature, and differential thermal expansion poses adhesion problems, greatly reducing output if the phosphor should work loose. Although a thinner phosphor layer would have less problem with stress, as well as more luminance, only one manufacturer, Lumileds Corporation, for example, has the advanced phosphor deposition technology for the conformal 25-micron coating of their white LEDs, ten times thinner than the rest. (Laboratory samples from other companies have been exhibited but the processes have not been proven to be commercially viable at this time.) Even these devices vary in color-temperature, across their faces as well as from chip to chip.

It would be an advantage if the phosphor could be situated away from the LED; particularly, it would be an advantage if the phosphor layer in a LED device was positioned remotely enough to be unaffected by the temperature variations of the LED itself. Such a phosphor target could then be as small as the combined area of the separate LED chips, to maximize luminance. Conventional arrays of white LEDs suffer from variations in color temperature. In order to overcome this problem manufacturers employ expensive binning procedures. However, with the current state-of-the-art LEDs, there is still considerable variation in the color temperature, even using tight bins. Further, since an array of close-packed LEDs in practice has a spacing that is typically one or more chip widths between chips, simple application of phosphor over the entire array would result in a diluted, highly uneven luminance.

Achieving higher white luminance from an LED, with uniformity and color-consistency, is critical for LED market penetration into general lighting uses, where the lower power consumption and longer life of LEDs can greatly contribute to energy conservation. Larger and more efficient phosphor coatings can be utilized if they can be separate from their blue-light sources. Such an advance could particularly benefit automotive headlamps, where current white LEDs are marginal at best in luminance. In fact, color temperature variations across a beam could lead to excess blue light, which is ophthalmologically hazardous.

In some applications it is advantageous to produce a number of smaller size sources from a single larger source. This is useful for example when an optical design is difficult to mold because the optical component would be too thick and/or too large. If such a large single source is separated into a number of smaller size sources of the same total area, the same lens design can be used for each such source, just scaled down to a moldable size. It would also be desirable that these smaller sources are more uniform than the larger parent source, or that they have a prescribed luminance output.

In other applications it would be useful to change the shape of a single source or multiple sources to another shape, such as from a square to a rectangle of a substantially equal area or vice versa. This is useful for such applications as LED headlamps where it is desirable to generate rectangular sources with aspect ratios (length to width) of between two to one to six to one. Such a method must, of course, preserve source luminance as much as possible.

Finally, it is desirable to have a highly efficient means of producing white LED light sources without the use of phosphors, by combining two or more LEDs of a different wavelength into a single homogeneous source. Traditionally, the approach has been to use three different colored LEDs to make white light, commonly a red, a green, and a blue LED. However, the traditional optical approaches do not produce a rectangular or square uniform light source using such RGB light sources. It would be beneficial to have means of producing a light source combining more than three LED wavelengths. Additionally, it would be useful to have a means of producing such light sources where the chromaticity of the light source is adjustable.

SUMMARY OF THE INVENTION

Embodiments of optical manifolds are described herein that provide the ability to efficiently combine a plurality of LED outputs into a single output that is substantially homogeneous, in a small, cost-effective package that may be made of a dielectric material. Optical manifolds are described that can be used to combine multiple LEDs of the same color to provide a high flux and high intensity output beam, or can be used to generate a multi-wavelength beam. For example, a red, green, and blue LED can be combined to make a "white" output. Embodiments are also disclosed that use a single LED or multiple LEDs and a remote phosphor coating arranged so that backscattered photoluminescence is recycled to the output. The optical manifolds use principles of nonimaging optics, and are designed to substantially alleviate luminance variations on the emitting surfaces of LEDs, and provide a substantially uniform light source. In addition, these optical manifolds can be used to produce a variety of non-square shaped light sources using square-shaped LEDs, including rectangular and asymmetric high flux light sources. These high-flux sources are useful for many applications such as for solid state lighting automobile headlamps. For example, for this application it is desirable to have a uniform rectangular LED-based light source with length to width ratio of 4 to 1. This is achievable with the optical manifold described herein. Solid-state lighting in general, and light-emitting diodes in particular, will find new applications through the benefits of the optical transformer described herein. To provide, for example a white LED, an optical system is disclosed for delivering the light of one or more blue chips to a spatially separate phosphor. Such a phosphor target could then be as small as the combined area of the separate chips, to maximize luminance. The phosphor layer is positioned remotely enough to be unaffected by the temperature variations of the LED itself.

The optical transformer described herein relates generally to utilizing the principles of non-imaging optics to fulfill the above-discussed illumination-engineering needs, via the origination of a new type of optical manifold. The edge-ray principle of non-imaging optics sets forth the surfaces of minimal increase of source etendue, a central quantity of non-imaging optics. Etendue is the product of source area $A_s$ and the projected solid angle of the source's output, multiplied by the square of the refractive index n of the optical medium surrounding the source:

$$E = n^2 A_s \sin^2 \theta$$

where θ is the off-normal angle of the solid conical angle which is equivalent to the source's radiation pattern. A diffuse Lambertian emission into 2π steradians is represented by θ=90°. This diffuse output is characteristic of the emission from an LED chip itself.

An ideal optical system conserves etendue, so that the enlarged output area of an ideal collimator leads to its usefully high intensity within a narrow beam angle, while the small size of the focal spot of a solar concentrator leads to the usefully multiplied flux from its wide beam angle.

The optical transformer described herein offers a new kind of optical manifold that provides etendue-limited illumination for collimated backlights, etendue-limited combination of plurality of light sources, and etendue-limited phosphor utilization. The useful fulfillment of these important tasks by the optical transformer described herein marks a new stage of LED evolution. For example, other photoluminescent materials besides phosphors can be used with the optical transformer described herein more easily than directly on LEDs, such as the photoluminescent semiconductor AlInGaP.

Some embodiments disclosed herein utilize total internal reflection only, and thus do not need metallic reflector coatings to be applied to their surfaces. Further embodiments comprise injection-molded sub-sections that are assembled into a complete manifold for producing a large "virtual chip" from the emission of several LED chips of smaller size. The virtual chip has better uniformity of luminance and color than the actual chips, and can be configured with usefully restricted angular output. Also, controlled non-uniformity can be engineered along with such angular restrictions, enabling an intensity prescription to be met by placing the focal plane of a projection lens on the manifold output.

The reversibility of light paths dictates that the embodiments disclosed herein could equally well be used to disperse a large source by transforming it into several smaller ones, as with a single LED illuminating numerous instruments on an automotive dashboard. With the optical transformer described herein it would be easy to have a backup LED that also fed the optical manifold for the dashboard.

BRIEF DESCRIPTION OF THE DRAWINGS

For a more complete understanding of this invention, reference is now made to the following detailed description of the embodiments as illustrated in the accompanying drawing, wherein:

FIG. 3A is a side view of an optical manifold comprising a plurality of square CPCs arranged in a 2×2:1 configuration;

FIG. 3B is an end view of an optical manifold comprising square CPCs in a 2×2:1 configuration;

FIG. 4A is a side view of a 2×4:1 optical manifold for eight LEDs and a 2:1 rectangular output, also comprising a mixing rod;

FIG. 12 is a perspective view of a monolithic 9:1 etendue-squeezer;

FIG. 13A is a cross-section of a luminance transfer duct with an optically inactive surface;

Corresponding reference characters indicate corresponding components throughout the several views of the drawings.

DETAILED DESCRIPTION

Figure 1A:
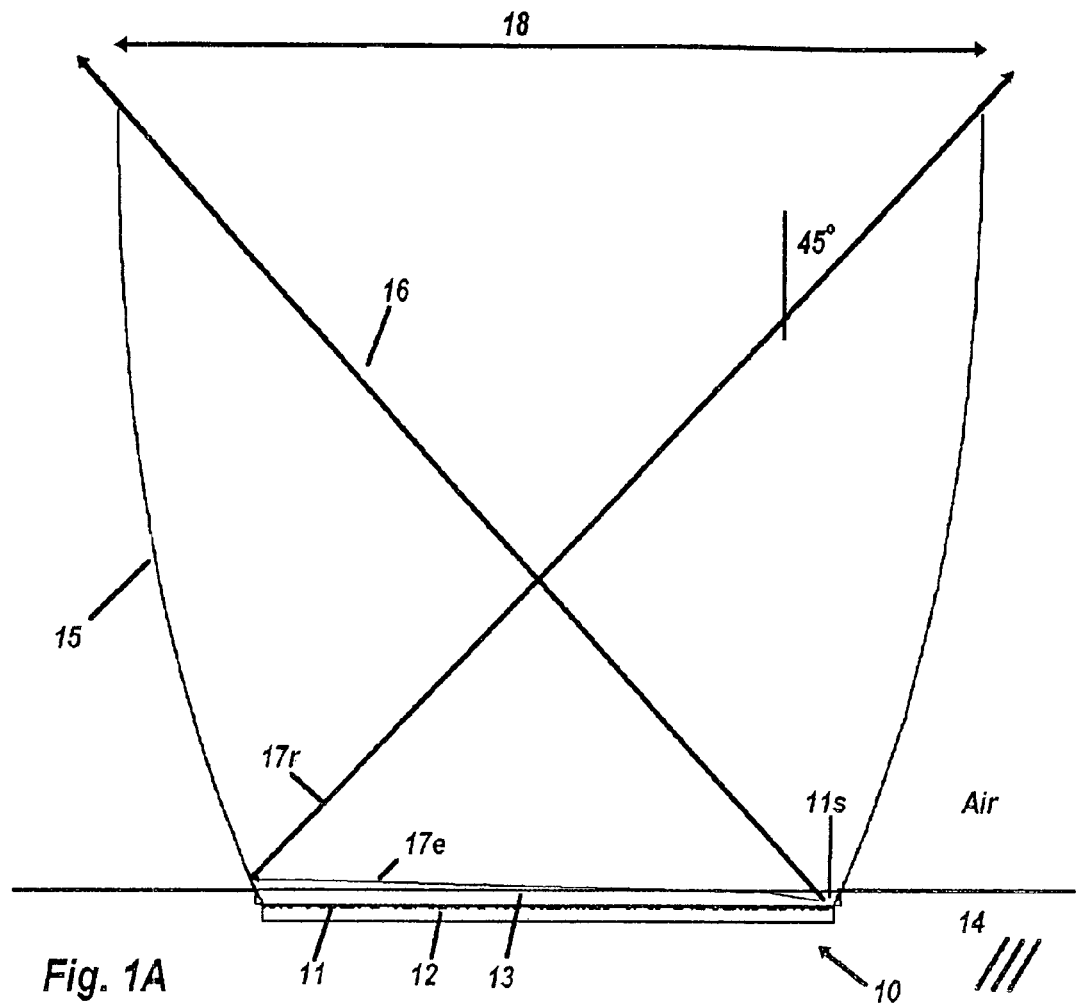
FIG. 1A is a cross-sectional view of a thin-film LED with an adjacent compound parabolic concentrator (CPC) reflector.

This invention is described in the following description with reference to the Figures, in which like numbers represent the same or similar elements.

Glossary of Terms and Acronyms

The following terms and acronyms are used throughout the detailed description:

angle rotator a device that delivers luminance from one plane to another lying at a tilt to the first CPC compound parabolic concentrator cross-CPC a three-dimensional (3-D) configuration having a 2-D CPC profile in two orthogonal directions dome of LED an approximately spherical LED cover made of transparent dielectric materials edge-ray principle the foundational principle of non-imaging optics, whereby a defining set of rays from the edge of an aperture are guaranteed to be delivered to the edge of another aperture, but the first aperture is not imaged onto the second etendue the optical manifestation of entropy, defined as the product of source area $A_s$ and the projected solid angle of the source's output, multiplied by the square of the refractive index n of the optical medium surrounding the source ITO indium tin oxide LED light emitting diode, a direct converter of low-voltage direct current to light in a narrow spectral band luminaire a light source and functionally associated light-control apparatus, such as a reflector or a shade luminance shifter a device that delivers luminance to a different transverse coordinate NA numerical aperture phosphor a photoluminescent material that emits light in response to external excitation, often continuing after the excitation ceases phosphor patch a component having a given size and shape that contains phosphor. It can comprise phosphor or phosphor dispersed in an encapsulant, such as a silicone fluid. The phosphor patch can also be made as a composite material where a phosphor layer (with or without an encapsulant) is deposited on a suitable transparent substrate, such as a sheet or film in a volume production process.

thin film LED an LED that comprises very thin layers and emits nearly 100% of its radiation from its top face TIR total internal reflection Overview For purposes of explanation, an "optical manifold" resembles the exhaust manifold of engines. In an optical manifold, channels are provided that either combine multiple light outputs into a single output, or distribute a single output over space. This term can designate a device for fiber optic fan-in and fan-out, such as in U.S. Pat. Nos. 6,850,684, 6,847, 774, 6,832,032, 6,655,848, 6,556,754, and 6,549,710 by Simmons et al. This multi-input, multi-output function is an informational task that is distinct from the efficient distribution of illumination. In fiber-optics parlance, such distribution is sometimes called 'fan-in' and 'fan-out', denoting the joining of several optical paths into one.

The distinction between 'fan-in' and 'fan-out' is important when reversibility is considered. That is, some such fiber-optic devices cannot be functionally interchanged, because some light on the reverse paths may spread out and be internally lost. However, it is an advantage to have a system that reversibly conveys light, so that its embodiments are operable in both directions. Thus the embodiments of the optical manifold described herein operate in both light-distribution, from a high-power source to many points of application, as well as light combining, of many sources into one large synthetic source with the same luminance as its input sources.

The term "optical manifold" was used in U.S. Pat. No. 4,362,361 by Campbell, et al., but therein this term denotes a partially reflective coating that repeatedly allows a small part of a laser beam to escape reflection as it tunnels inside a slab, so that multiple beams are made from one. This usage differs from what has become the conventional usage, in that "optical manifold" now denotes branching many-to-one light paths.

Figure 19:
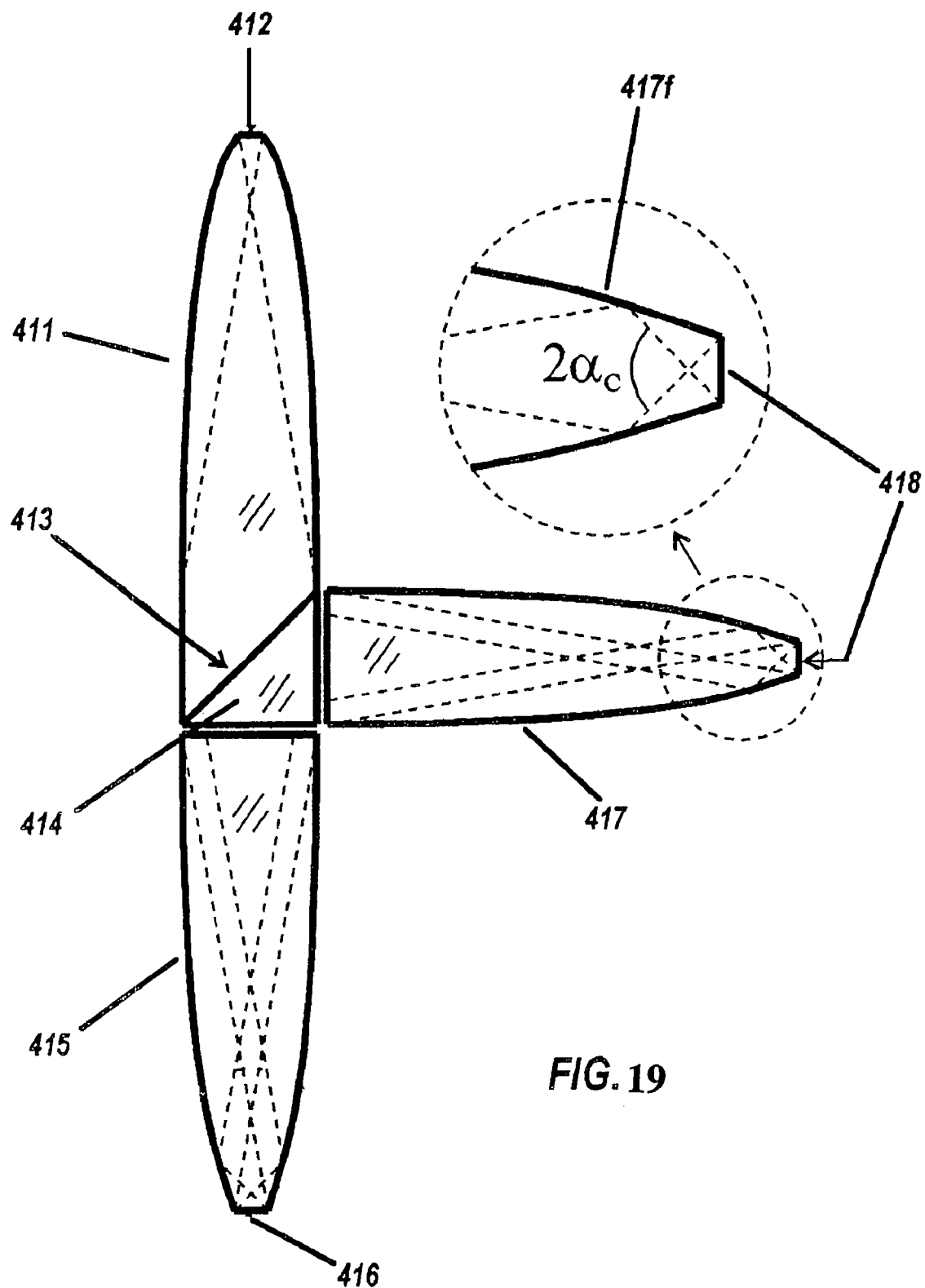
FIG. 19 is a cross-sectional view of another alternate configuration, including a phosphor-coated surface.

U.S. Pat. No. 6,186,650 discloses an "optical manifold" of branching waveguides, with numerous embodiments illustrated. It is believed that an actual ray tracing of these structures, however, would show considerable leakage, as shown by FIG. 19A and FIG. 19B in that patent. Moreover, it is believed that this prior art does not conserve etendue, giving outputs that are much weaker than the input. This is because the squared-off endings of the ports will cause much of the guided light therein to be reflected backwards.

Etendue, like entropy, is a measure of optical disorder, basically being the product of spatial extent and angular extent. Increasing the etendue of light can be considered as the optical equivalent of turning work into waste-heat, where the optical work would be the luminance of light-emission, and the waste-heat would be the useless dispersion of this light. An "etendue-limited" optical device is one that delivers light with nearly the original luminance, once inevitable reflections and scatterings are accounted for. The optical transformer described herein is etendue-limited, in that the input area-angle product is preserved for light passing through it. Some embodiments of the optical transformer described herein receive light from a plurality of sources to create a large, highly uniform synthetic source that may prove highly useful in the art of illumination. Other embodiments form distributed lighting systems, as in vehicle dashboards, that preserve both luminosity and etendue, enabling fewer LED sources to be necessary to accomplish the illumination task.

One example of an etendue-limited optical element is the compound parabolic concentrator (CPC), disclosed by Winston in U.S. Pat. No. 4,002,499. Another is the compound elliptic concentrator (CEC), disclosed by Winston in U.S. Pat. No. 3,957,031. Both of these can be utilized as a building block of the optical transformer described herein. A recent case is the corner-turning element disclosed by Fein in U.S. Pat. No. 6,819,687, which is etendue-limited only for angles well under the critical angle (NA<1). Designed for use with the angular limitations of fiber-optic illumination, this device has significant limitations that are surpassed by a similar-looking but geometrically different angle-turning component of the optical transformer described herein. Fein's device is intended for the NA=0.5 range of fiber-optic illumination, so that light in the NA=1 range, which is that of the optical transformer described herein, would leak out of it. The optical transformer described herein has the NA=1 range because this enables it to convey four times the irradiance of NA=0.5 systems such as Fein's. A further limitation of Fein's device is the NA=1 that its design permits, because its primary application is right-angle turns in biomedical settings, for which two 45°-turners are utilized at NA=0.5. In contrast, the angle-rotating components of embodiments of the optical transformer described herein have very little leakage at any arbitrary turning angle of the NA=1 light it conveys, so that the 90° angle rotators illustrated herein could as easily be extended to comprise a 360° device suitable for a helical configuration, should such a novel requirement arise. This flexibility enables optical transformer embodiments described herein to address the entire span of applications of both light combining and light distribution, with maximal flux, something yet to be accomplished by the prior art. This flexibility is further exemplified by embodiments of the optical manifold disclosed herein comprising two opposing angle-rotators acting as luminance shifters, another useful component of systems with arbitrary branching patterns of distributed illumination.

Another improvement provided herein regards manufacturability of optical transformers. In the prior art, such as exemplified in Fein, all the surfaces must be optically active on such optical angle-turning devices. This makes it difficult to have points of injection for a part without introducing lossy surface defects on the optically active surfaces. Optical transformers are described herein that overcome this problem by providing inactive surfaces along the length of the device that can be used for points of injection. The inactive surfaces can be used as a means of holding the devices, and they can be freely modified into a wide range of shapes, without affecting the shape of the active surfaces of the device. The inactive surfaces are deliberately created by the pattern of ray distribution within the angle-rotator, providing an envelope of non-interaction with the light field, within which non-lossy attachments may be made.

DESCRIPTION

A better understanding of the features and advantages of the optical transformer described herein will be obtained by reference to the following detailed description and accompanying drawings, which set forth illustrative embodiments in which the principles of the invention are utilized.

An optical manifold is described herein that receives light from a plurality of solid-state sources and combines them into a single virtual-source output having little more etendue than the sum of the inputs. When the sources have different dominant wavelengths, the output light has the chromaticity of their colorimetric mixture. Due to the reversibility of light, the same shape of manifold could be used to disperse the light from a single large solid-state source among multiple virtual sources.

Two solid-state light sources in particular are contemplated for the optical transformer described herein: thin LEDs and dome-packaged high-power LEDs. Their packaging geometry dictates differing configurations of injection means for the optical transformer described herein. The prior art encompasses several types of injector means, including CPCs and immersion lenses, as well as conventional domed packaging.

FIG. 1A is a cross-sectional view of an optical manifold including a thin-film LED 10 comprising a light-emitting layer 11, reflective means 12, and a window 13. The LED 10 is embedded in a protective transparent epoxy 14. An external CPC reflector 15 is accurately situated on the surface of epoxy 14 so that it just straddles window 13 over LED 10, which is typically about a millimeter across. One advantage of the optical manifold described herein is that it allows more efficient cooling of larger (or multiple) LEDs. The difficulty of cooling larger or multiple chips is one of the motivations for the optical transformer described herein. (Electricity and heat sinks are not shown.)

Thin-film LEDs, such as the LED 10 shown in FIG. 1A, emit nearly 100% of their output flux from the top surface of the device. Such devices have been produced in the laboratory and have been shown to the public by, for example OSRAM Semiconductors of Regensburg, Germany, which has begun producing them commercially in red and yellow with green and blue by the middle of the year 2005. A variety of thin emitter technologies are currently proposed by OSRAM Corporation of San Jose, Calif., including Indium Gallium Aluminum Phosphide (InGaAlP) and Indium Gallium Nitride (InGaN). All the emitting architectures shown by OSRAM Semiconductors to date use a wire bond on their top surface. The current thickness of the emitting layer in these devices is on the order of 0.1 microns and the overall chip depth is two to five microns. Therefore the side emissions from these devices are quite small, so they are ideally suitable for use in many of the embodiments of this invention.

FIG. 1A further shows source-point 11s emitting edge-ray 16, which just clears the upper edge of CPC 15. Also shown is edge ray 17e emitted horizontally, thereby intercepting the base of reflector 15, from which it is reflected into ray 17r, which in turn just clears the upper edge of CPC 15. The 45° design angle is shown. It applies to both direct ray 16 and reflected ray 17r. Double-arrow 18 denotes the width of the virtual source generated by CPC 15. Its width is 1/sin 45° times the width of emitting layer 11, thus preserving etendue.

Although FIG. 1A shows CPC 15 as a hollow metal reflector, it could as well be filled with a dielectric such as cast epoxy. If the 45° design angle would be slightly reduced to the critical angle (40°), the CPC would become slightly taller, and extreme rays 16 and 17r would be refracted to horizontal, for a planar air-interface across the top of CPC 15. Such a filled CPC would couple the LED into air with transverse magnification equal to the refractive index of the transparent filling material. (The area is increased by the factor of $n^2$.) For greater magnifications, a narrower design angle is needed. When that angle is reduced to 10°, reflector 15 can be dispensed with, since total internal reflection suffices.

U.S. Pat. No. 3,739,217 by Bergh and Saul teaches that the extraction of light from within a high-index-of-refraction body can be increased by roughening either a front emitting surface or a back surface of the high-index layer, where this roughened back surface interfaces with a reflective layer. However, the Bergh et al. patent does not specify the reflector-material nor does it indicate whether the reflector should be in direct contact with all surfaces of the high-index body. The Bergh et al. patent appears to indicate in its FIGS. 2 and 3 that there is an air gap between the illuminated body and the back reflector.

Figure 1B:
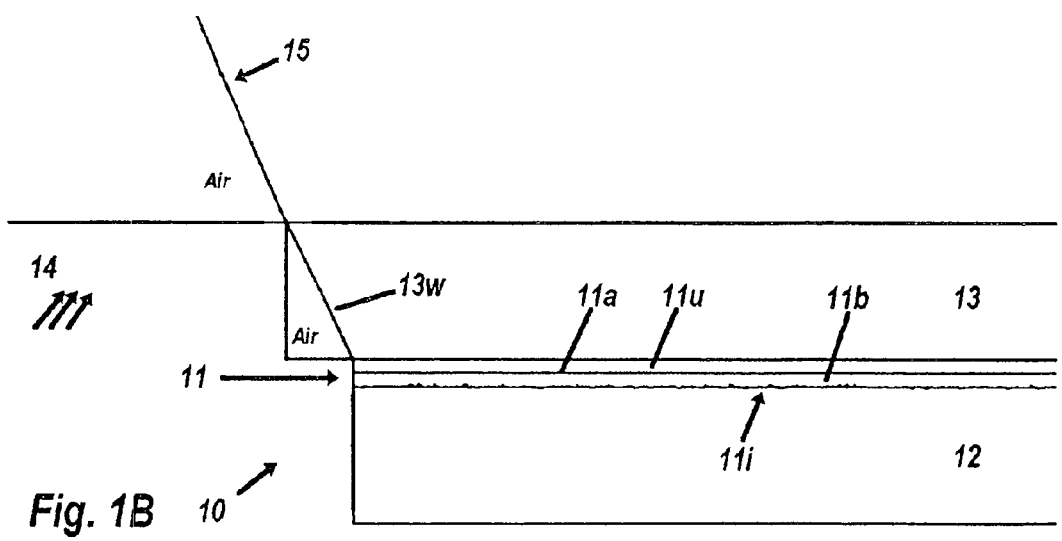
FIG. 1B is a magnified cross-sectional view of part of FIG. 1A, showing the LED with a diffuse reflector in contact with the active epitaxy layer.

FIG. 1B is a magnified view of the LED 10 of FIG. 1A, showing emitting layer 11 comprising thin (approximately 0.1 microns) active layer 11a situated in the middle, InGaN layer 11u above it, and layer 11b below it. Window 13 can be seen to have slanted edge 13w to prevent light-escape. FIG. 1B further shows an approach to enhancing the luminous extraction efficiency of a top-emitting LED (or of a predominantly top-emitting LED) wherein electrically conductive reflective layer 12 also acts to power epitaxy layer 11, with which it is in direct contact. Roughened interface 11i is the contact surface. This roughening can be achieved on the epitaxy layer 11 by chemical etching or other well-known methods. Once the epitaxy layer is roughened, the reflective layer 12 can be deposited thereupon by vacuum, sputtering, or other deposition methods.

The material properties of reflector layer 12 must be precisely specified to match with the properties of the epitaxy layer. For example, where an electrically conductive reflective layer is needed, a metallic material is best, and its index must have the proper complex value to achieve a high diffuse reflectance. For a blue LED using an epitaxy layer of GaInN or GaN for example, the visible-wavelength index of refraction of both GaInN and GaN is about 2.54. Calculating the reflectance of such a metal layer involves using the complex index of refraction in the Fresnel-reflection equations, so that both the real and imaginary components of the index of refraction of a candidate material are critical. The reflectance for rays striking at a zero incidence angle can provide a metric for choosing appropriate materials. A suitable equation for carrying out such an analysis is:

$$R=[(N_{epi}-N_s)^2+k_s^2]/[(N_{epi}+N_s)^2+k_s^2]$$

where:
R is the reflectance at zero incidence at the interface of the epitaxy and the metal layer,
$N_{epi}$ is the index of refraction of the epitaxy,
$N_s$ is the real part of the index of refraction of the metal, and
$k_s$ is the imaginary part of the index of refraction of the metal.

Assuming that the epitaxy layer has index 2.54, the metal needs the real component to be low and the imaginary component high. Silver has a low real component (0.12) and a very high imaginary component, over wavelengths ranging from 450 nm (k=2.47) to 700 nm (k=4.52). At 550 nm a thick layer of silver has an index of refraction (real) of approximately 0.12 and an imaginary value of 3.34. Plugging these values into the aforementioned equation yields a reflectance of 0.93. By way of comparison a layer of aluminum would have a much lower reflectance in contact with GaInN, as it has a real value of 0.76 and an imaginary value of 5.32 at 550 nm. In this case the reflectance at the interface of the two materials, for zero incidence angle rays, can be calculated by the same equation as 0.80. This is a very significant difference, especially with the extraction efficiency of the device having a non-linear relationship to the reflectance of this layer, because internal rays in the epitaxy undergo many boundary reflections before being either absorbed or extracted from the layer. Thus a small improvement in the reflectance of this bottom interface layer can produce a large improvement in the external quantum efficiency of the LED.

Such a reflective layer may also be made of dielectric materials using multi-layer approaches, particularly the Bragg reflector, common to the industry. However, electrical conductive paths known as vias must be introduced somewhere through this otherwise non-conductive layer, in order to power the semi-conductor. The use of a dielectric layer however may increase the internal resistance of the device and therefore increase the internal heat generated for a given applied voltage. Further, it is known that it is very difficult to design a Bragg reflector which has high reflectance for a wide range of wavelengths and incidence angles. This is especially a problem for LEDs which employ conformal phosphor coatings on the die. Thus silver may be deemed a superior solution over a dielectric reflector as it performs well over a wide range of incidence angles and wavelengths.

U.S. Pat. No. 6,784,462 teaches how to make an "omnidirectional" back reflector with very high reflectance for an LED by combining a quarter wavelength layer of Indium Tin Oxide (ITO) in front of a layer of silver. The thin film approach in the '462 patent, however, assumes that the silver and ITO layers are smooth, precluding any roughening of the bottom of the LED proper, known as the 'epitaxial layer' because it is made atop a substrate, by an atomic beam in a vacuum. Because of extensive light trapping within a cube of high-index material, a standard LED geometry, achieving maximum extraction efficiency makes it imperative to have a roughened surface at the interface where the reflector is in contact with the epitaxial layer. This is needed to achieve high diffuse reflectance, which causes trapped light to be randomly redirected for another chance at escape. Further, ITO has a much lower electrical conductance than silver, which may be a disadvantage for some designs.

Getting trapped light scattered out before it is absorbed makes it desirable to have either a bottom diffuse reflector or a top scattering layer incorporated with layer 11u of FIG. 1A. A combination where both approaches are employed can also be utilized. However, one can introduce too much scattering in the device when both a top and bottom scattering layer are used and thus reduce the device extraction efficiency. It can be shown that without top scattering introduced into layer 11u, that a perfect reflector such as described in U.S. Pat. No. 6,784,462 will not perform as well as the diffuse silver reflector described herein. Further, in many instances it is desirable to have a smooth interface at the top of layer 11u and one cannot introduce a scattering or diffusing layer on its interface or below its top emitting surface. In these instances the rear diffuse reflector proves most beneficial and has been stated herein, will outperform even a 100% perfect specular reflector.

Furthermore, silver will lose its reflectivity if not properly protected from contact with air or corrosive materials (it is highly reactive with sulfur), so it must be sealed by suitable protective layer. Typically, if the silver is sandwiched between the epitaxial layer and a suitable substrate such as Germanium, then no noticeable degradation of this material takes place as it is hermetically sealed. If edge protection is required there are many suitable materials known to those skilled in this field of semi-conductor design.

Regarding the matter of a roughened back-reflector made of silver, computer simulations thereof, using well-known Monte-Carlo ray-tracing techniques, show that the optical transformer described herein will greatly benefit from having this feature in the LEDs that illuminate its embodiments, particularly those disclosed below that recycle the emission of a phosphor.

This roughened-silver reflector can of course greatly benefit thin-film LEDs whether or not used in conjunction with the optical transformer described herein. Referring again to FIG. 1B, another such LED optical improvement is the reduction of the absorptance of lower epitaxy-layer 11b, where the majority of luminosity losses occur within epitaxy layer 11. As an epitaxy, this layer is typically deposited on a sapphire crystal. In the production of thin-film LEDs the epitaxy wafer is removed from the sapphire. (A summary of the processes needed to remove the InGaN wafer from the sapphire substrate was described by Dr. K. Streubel of OSRAM-Opto in a presentation titled "Thin-film Technology for Light Emitting Diodes" at Intertech LEDs 2004 conference in San Diego, Calif., USA, Oct. 20-22, 2004.)

The absorption of the lower layer is not essential to its function, and seems to be confined to the superficial atomic crystal-planes, several tens of nanometers out of the layer's total thickness of 5,000 nm. According to the research of S. Schad and B. Neubert of the University of Ulm in Germany, described in their paper "Absorption in InGaN-on-Sapphire Based Light-Emitting Diodes", Annual Report 2003, Optoelectronics Department, University of Ulm, the first thin layer of an InGaN-type LED grown on a sapphire substrate, approximately 65 nm, is responsible for most of the absorptance of the InGaN LED in the blue wavelength. They theorize that the remaining semi-conductor material grown on the substrate is highly transparent. These planes were so near the sapphire that their crystal structure and absorptance greatly increased. In some embodiments, neither layer 11a nor 11u has this thin absorptive layer. Precise removal of this strained sub-layer is possible with magnetorheological polishing, greatly reducing the absorptance and thereby enhancing the LED's external quantum efficiency.

A separate possibility for enhancing that efficiency is to cause the front layer 11u of FIG. 1B to have bulk-scattering characteristics, rather than the complete transparency typical of such a layer. A study using a ray-tracing model showed that the introduction of a scattering coefficient of 100/mm into layer 11u gives an approximately 40% increase in efficiency for a SMD-type LED, where layer 11u does not have any appreciable scattering and does not have a phosphor layer in contact with it. Similar improvements are seen for a dome type monochrome LED. If the scattering coefficient is increased to 200/mm, a very slight improvement is seen. Whereas beyond this level there is reached a point where the performance degrades from the maximum. The use of a means of scattering in the front layer typically does not have a beneficial effect on performance when it is used in conjunction with the roughened back-reflector approach already discussed. There is a very slight improvement to the extraction efficiency if a roughened-back reflector is used in combination with layer 11u having a 10/mm scattering coefficient. Beyond this level of front scattering the performance falls below either single approach.

The optical manifolds disclosed herein that recapture back-scattered light can be enhanced significantly when the extraction efficiency of the LED is high. Particularly, it is believed that the remote phosphor embodiments described herein will outperform the prior art in terms of external quantum efficiency, particularly conformal-phosphor LEDs. The performance of the novel optical systems disclosed herein can be improved dramatically when they are used in conjunction with top-emitting or substantially top-emitting LEDs, particularly those which employ a highly reflective back layer with modest scattering.

Figure 2A:
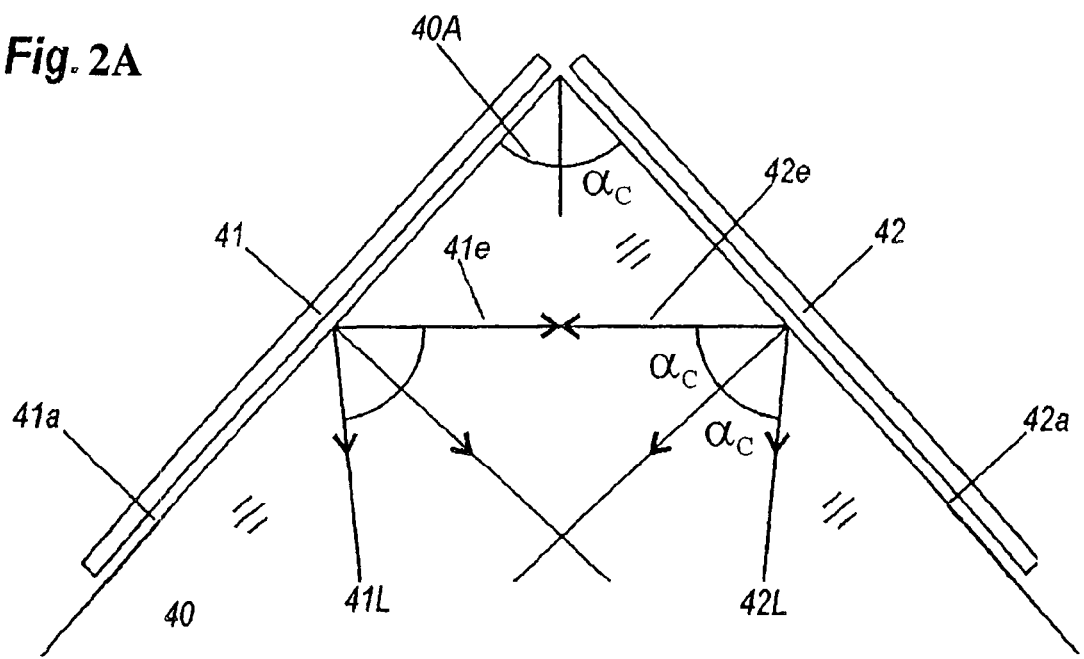
FIG. 2A is a cross-sectional view of two thin-film LEDs and a prism coupler.

FIG. 2A is a cross-sectional view of a prism coupler 40 that has an interior angle adapted to the critical angle $\alpha_C$ of the prism material. Thin LED 41 sends Lambertian emission across airgap 41a, wherein it is confined between upper edge ray 41e and lower edge ray 41L. Thin LED 42 emits across airgap 42a and enters prism 40, wherein its Lambertian emission becomes confined to half-angle $\alpha_C$, between upper edge ray 42e and lower edge ray 42L. The purpose of interior angle 40A being $2\alpha_C$ becomes apparent when ray 41e is seen to internally reflect off air gap 42, to join ray 42L. Thus the internally reflected light fills the angle space outside the edge rays of the incoming light.

Figure 2B:
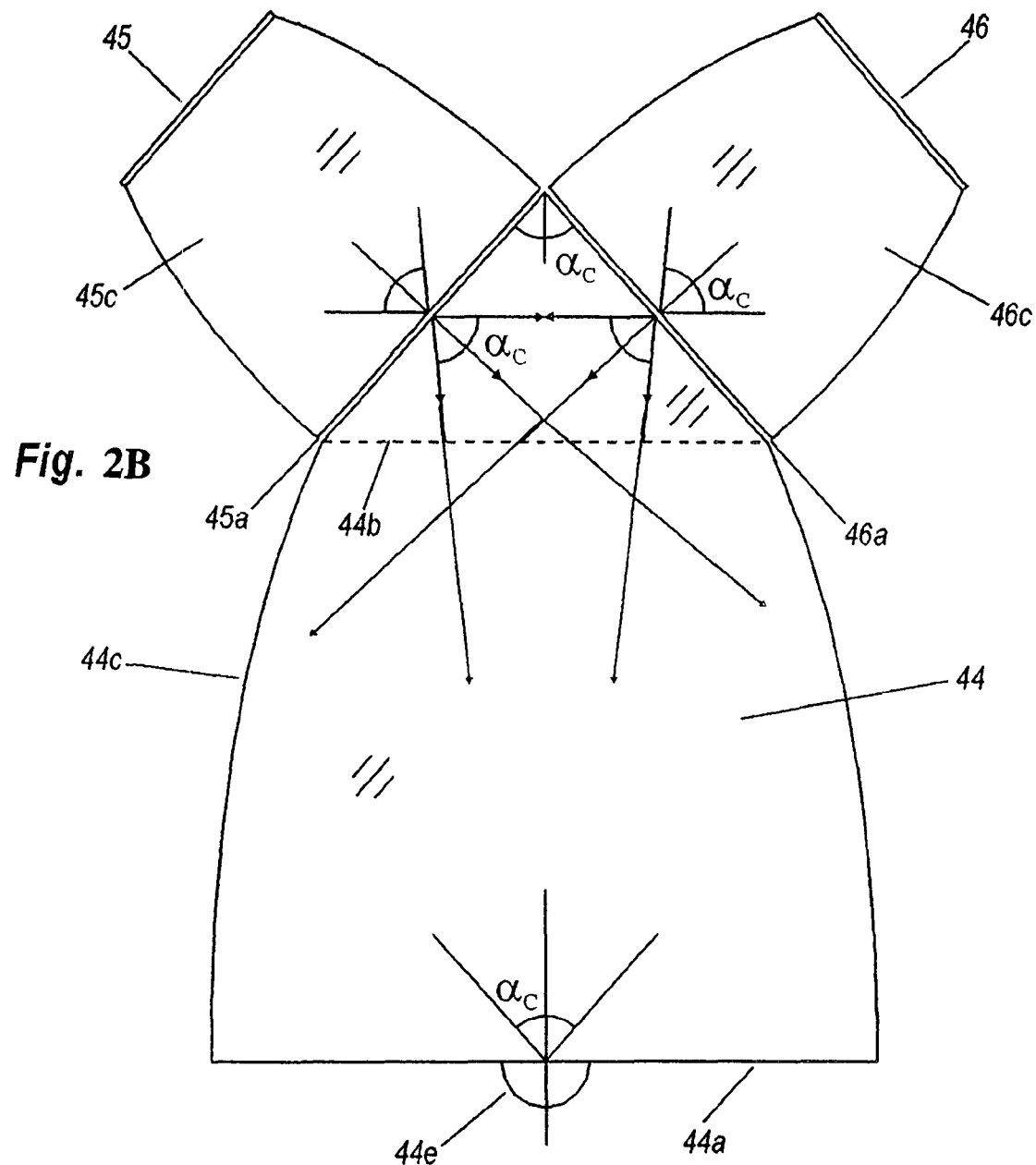
FIG. 2B is a cross-sectional view of an optical manifold 44 that utilizes the prism coupler shown in FIG. 2A, including two thin-film LEDs immersed in smaller CPCs, each with a prism coupler, and a large CPC.

FIG. 2B is a cross-sectional view of an optical manifold 44 that utilizes the prism coupler shown in FIG. 2A. The optical manifold 44 comprises a dielectric CPC 44c and a conjoined prism block 44b. The thin LED 45 is immersed in a dielectric CPC 45c, which is wider at airgap 45a, across which it shines Lambertian light into manifold 44, wherein refraction confines it to critical angle $\alpha_C$. A similar approach is used with LED 46, CPC 46c, and airgap 46a. The prism coupler then receives two inputs of radiation spanning an angle $2\alpha_C$, through 45a and 46a, and transforms them into a fully Lambertian pattern at 44b (about ±90° full angle). A CPC 44c expands from its width at block 44b to its exit face 44a. This enables all the light to exit as Lambertian emission 44e, forming a "virtual chip". An exit surface at 44b would trap light beyond critical angle $\alpha_C$, hence the use of CPC 44c.

FIGS. 1A through 2B show two-dimensional profiles acting on rays running in the plane of the Figures. In some practical embodiments a 3-dimensional system is formed by extruding such a profile orthogonally to its plane. The thickness of this extrusion distarice is typically equal or slightly larger than the width of the square chip. This will result in losses in the extrusion direction of rays not in the plane of the profile being extruded. Instead, a two-way cross-CPC can be used, with the same profile used in orthogonal directions. Examples of this are shown in FIGS. 3A, 3B, 4A, 4B, 5A, and 5B. Critical to high system efficiency is the use of a transparent material with suitably low absorptance, because of the multi-pass nature of the passage of light within these embodiments. For example, polycarbonate, a routinely employed injection-molded plastic, has so much absorption that these embodiments will have serious losses, whereas acrylic does not.

FIG. 3A is a perspective view of optical manifold 80, a dielectric-filled 2×2:1 multi-CPC embodiment. It comprises four input cross-CPCs 81 and output cross-CPC 82, all square in cross-section, as seen with dividing line 80d. The cross-section of each of these four cross-CPCs 81 is selected so that immersed LEDs 83 will have all their light sent across plane 80d into cross-CPC 82.

FIG. 3B is another perspective view of optical manifold 80, also showing exit surface 84, which must connect to another device of similar refractive index, else some of the concentrated light will be returned by internal reflection. It is possible to join manifold 80 with some of the embodiments to be shown below.

FIG. 4A is perspective view of a 2×4:1 optical manifold 90, comprising a plurality of input cross-CPCs 91 that receive light from a corresponding plurality of immersed LEDs 92, a rectangular mixing section 93 that receives the light from the plurality of cross-CPCs 91, and a rectangular output cross-CPC 94 that receives light from the rectangular mixing section.

Figure 4B:
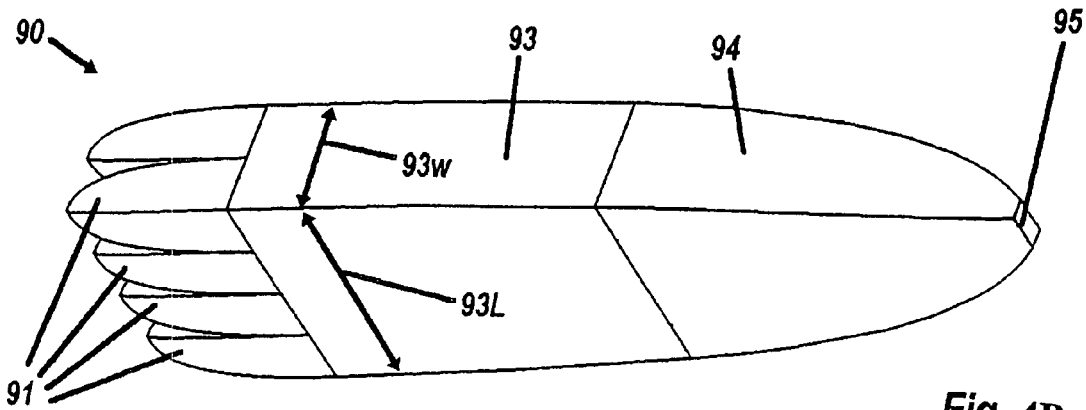
FIG. 4B is another side view of a 2×4:1 optical manifold for eight LEDs and a 2:1 rectangular output, also comprising a mixing rod.

FIG. 4B is another perspective view of the manifold 90 shown in FIG. 4A, also including an approximately rectangular output surface 95 from the output cross-CPC 94.

Figure 5A:
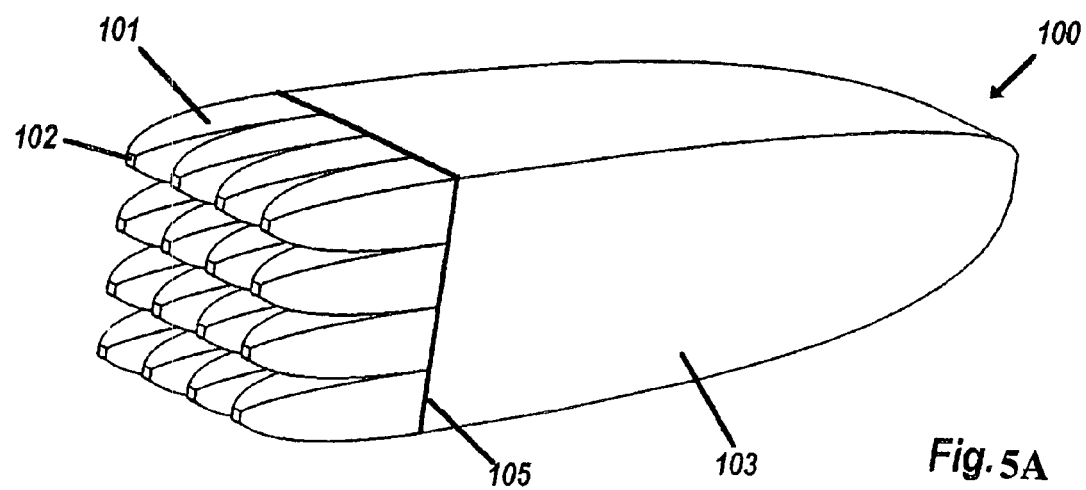
FIG. 5A is a perspective view from the input side of a 4×4 optical manifold that feeds the output of sixteen blue LEDs through a blue-pass filter.

FIG. 5A is a perspective view of a 4×4:1 optical manifold 100, comprising a plurality of (in this embodiment sixteen) square dielectric input cross-CPCs 101, a corresponding plurality of immersed LEDs 102 connected respectively to the cross-CPCs, and an approximately square output dielectric cross-CPC 103 coupled to collectively receive the light output from each of the cross-CPCs. Also shown is an immersed square filter 105, installed for the case of blue LEDs 102. In some embodiments, square filter 105 would be a blue-pass reflector applied across the input face of output CPC 103, then optically joined to the array of input cross-CPCs 101. Such a blue-pass reflector can be constructed in several ways well known to those skilled in this art, such as deposition of thin film multi-layer dielectric or other materials onto a suitable substrate, and through single or multi-layer reflection or transmission holographic coatings. In a 1981 publication (Miles, Webb, and Griffith, "Hemispheric-field-of-view, non-imaging narrow-band spectral filter", *Optics Letters, Vol.* 6#12 pp. 616-618 (December 1981) two hollow reflective CPCs are used face-to-face to collimate light into a narrow-band spectral filter and then condense the filtered light. Embodiments of the optical transformer described herein, in contrast, utilize a dielectric CPC instead of a hollow CPC. Another difference is using a short-pass filter or band-pass filter by which short wavelengths are transmitted and long wavelengths are reflected (rather than a narrow-band filter). For many applications, a band-pass filter with a lower cutoff below the working range of frequencies may be treated as equivalent to a short-pass filter. The embodiment of FIG. 5A has a plurality of input CPCs rather than a single CPC. The condenser CPC 103 has a phosphor target. Condenser CPC 103 combines and homogenizes the input from sixteen LEDs 103 onto a single exit surface 104 on which the phosphor target resides. A novelty of the embodiment of FIG. 5A is the function of filter 105, to reflect the back emission of phosphor 105. This is the recycling principle of certain embodiments of optical transformer described herein, which is believed to be a novelty.

Figure 5B:
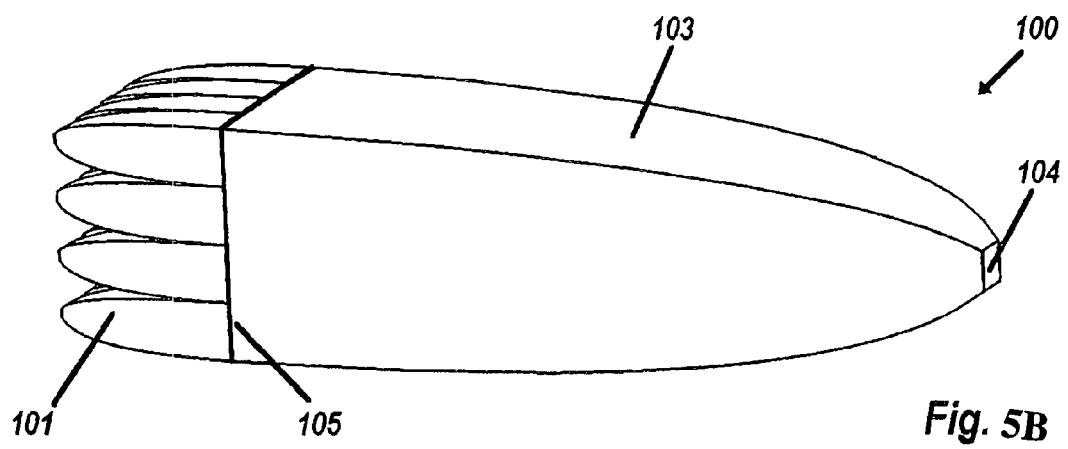
FIG. 5B is a perspective view of the manifold of FIG. 5A from the output side, where the blue-passed light is condensed onto a patch of highly uniform phosphor.

FIG. 5B is another perspective view of the optical manifold 100 shown in FIG. 5A, and in addition comprising an approximately rectangular exit face 104.

It is desirable that the Lambertian distribution of an immersed LED be compressed to the critical angle, but expanding area in an etendue-conserving fashion. Equally important for building blocks of the optical manifolds of the optical transformer described herein are etendue-conserving ways to transport luminance at a high NA, which is typically around 1, while mixing it to achieve high uniformity and a constant color. The NA can be calculated using either of the following equations:

$$NA = n\sin(\pi/2 - \theta_C) = n\sqrt{(1 - 1/n^2)},$$

where $\theta_C$ is the critical angle of the material and n is the index of refraction of the material. This equation is useful for determining the NA of a system where the input ray bundle is already inside a dielectric media. In this instance the value n in the equation is greater than 1.0.

Figure 6:
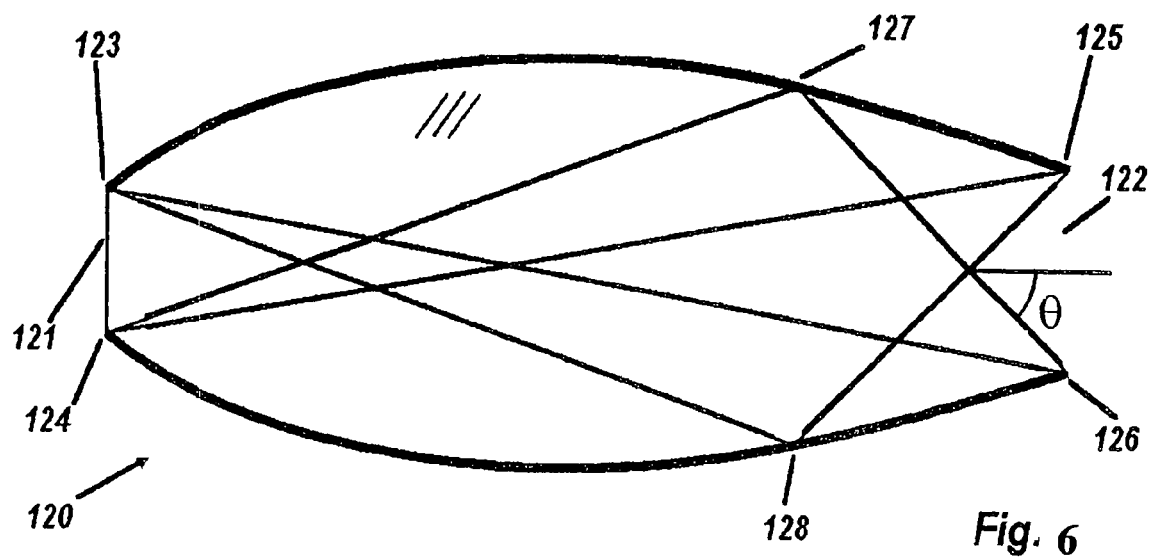
FIG. 6 is a cross-section of an angular compressor.

It is desirable that the Lambertian distribution of an immersed LED be compressed to the critical angle, but expanding area in an etendue-conserving fashion. FIG. 6 shows distribution-transforming element 120, with a wide-angle (±90°) port 121 marked by end-points 123 and 124, and spatially wider narrower-angle port 122, marked by end-points 125 and 126. Point 127 is a point on the surface of element 120 between end points 123 and 125 from which a ray at the critical angle θ of the transparent medium composing element 120 will just exit from element 120 at end-point 126 on the opposite side. Point 128 is directly opposite point 127. From end-point 123 to point 127, the profile of element 120 is an ellipse with foci at opposite points 124 and 126. Between end-point 125 and point 127 is a parabola with focus at point 124 and axis parallel to the ray running from point 127 to point 126. The opposite side, from end-point 124 to point 128 and from point 128 to end-point 126, is correspondingly shaped. To the left of points 127 and 128 is a CEC (compound elliptical concentrator), while to their right is a CPC. The narrower-angle output of distribution-transforming element 120 serves as suitable input for further embodiments. The advantage of this device relative to a simple CPC with exit angle 2θ is that TIR is more easily achieved at the bottom edges 123 and 124.

Equally important for building blocks of the optical manifolds of the optical transformer described herein are etendue-conserving ways to transport luminance at a high NA, which is typically around 1, while mixing it to achieve high uniformity and a constant color. The NA can be calculated using either of the following equations:

$$NA = n\sin(\pi/2 - \theta_C) = n\sqrt{(1-1/n^2)},$$

where $\theta_C$ is the critical angle of the material and n is the index of refraction of the material. This equation is useful for determining the NA of a system where the input ray bundle is already inside a dielectric media. In this instance the value n in the equation is greater than 1.0.

Prior art relating to transport of illumination is shown in U.S. Pat. No. 6,819,687 by Fein, particularly his FIG. 1F. This corner-turning configuration is only possible with conventional reflectors, since TIR will fail for arbitrary rays coming in. For all-TIR operation Fein has a device in his FIG. 3B for a 45° turn. An optic with a similar geometry is redrawn here, in FIG. 7A, to promote discernment of the distinction from it, and advantages over it, of the angle-rotator disclosed herein.

Figure 7A:
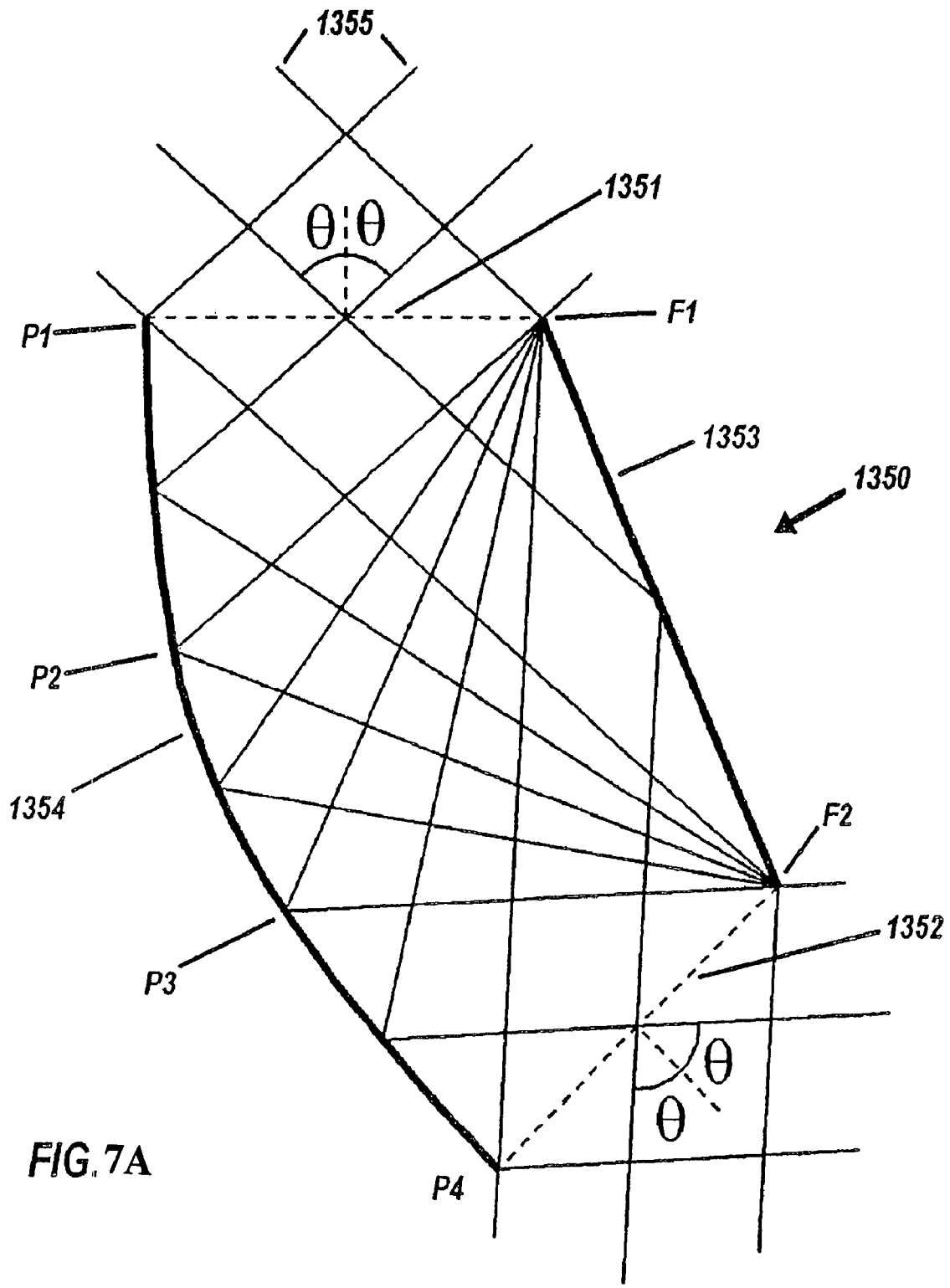
FIG. 7A is view of prior art, including a corner turner.

FIG. 7A shows the construction of Fein's corner-turner 1350, with ports 1351 and 1352 lying at a 45° mutual orientation. It uses a construction angle θ, which is the complement of the critical angle $\theta_c = \sin^{-1}(1/n)$, which for n=1.495 is θ=49°. This corresponds to the maximum angle of guided light, or approximately NA=1. Inside wall 1353 is a flat mirror for which TIR is operable, running from point F1 on port 1351 to point F2 on port 1352. Outside wall 1354 comprises a parabolic arc running from point P1 on port 1351 to point P2, with focus at point F2 and axis making an angle θ to the normal to the entrance aperture 1351, in the direction (clockwise direction as seen in FIG. 7A) more nearly perpendicular to the line F2-P1, an elliptical arc running from point P2 to point P3, with foci F1 and F2, and a parabolic arc running from point P3 to point P4 on port 1352 with focus at point F1 and whose axis makes an angle θ to the normal to the exit aperture 1352. Construction lines 1355 are reflected against outer wall 1354 in the same way as the limiting rays of light at approximately NA=1.

Figure 7B:
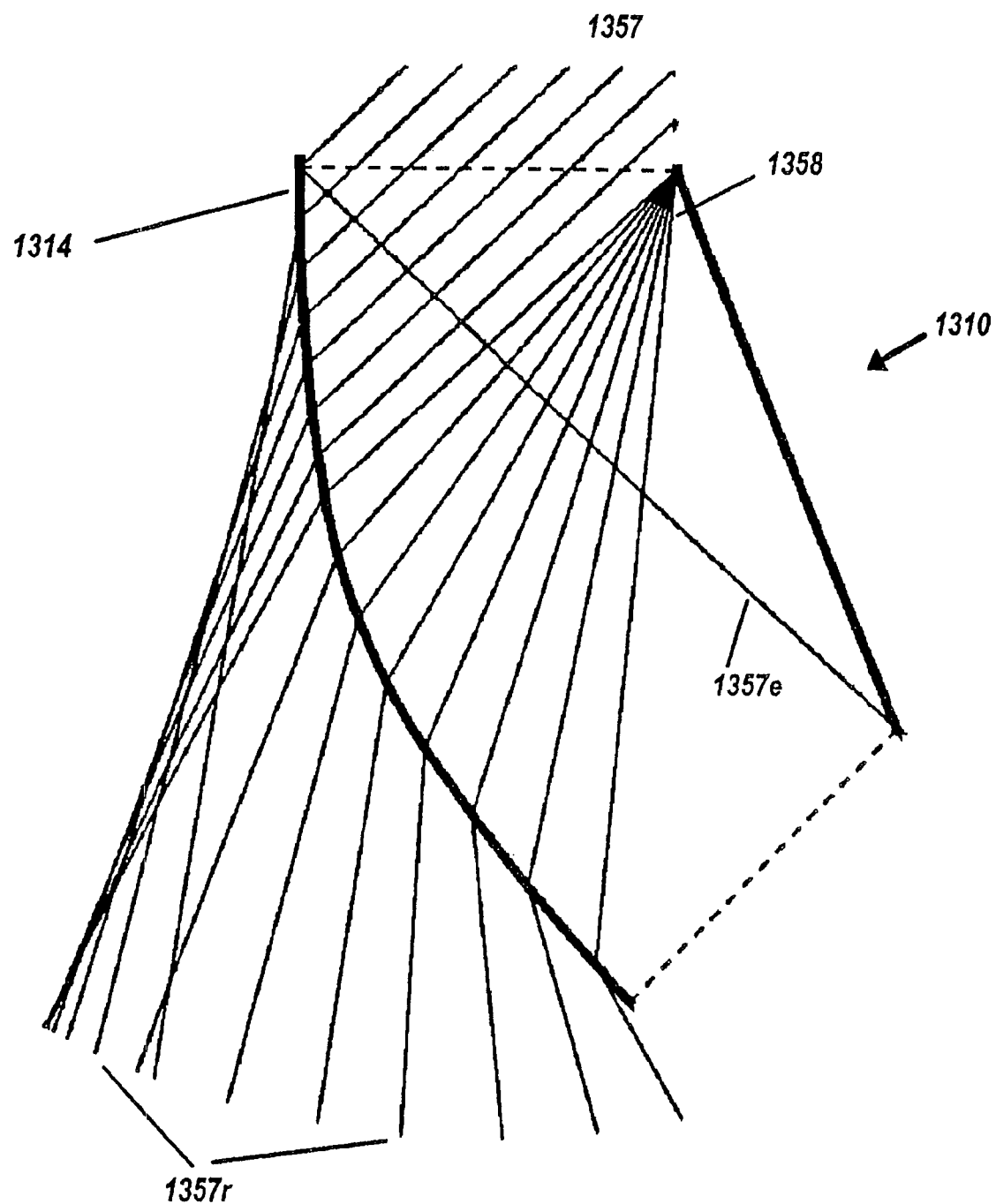
FIG. 7B is a ray trace of the prior art shown in FIG. 7A.

Although these construction lines are for NA approximately equal to one, the device of FIG. 3B of Fein cannot actually transport such radiation via only total internal reflection. This is shown in FIG. 7B, which depicts a ray trace of corner turner 1310. Edge rays 1357 in FIG. 7B make an angle θ to the normal to entrance aperture, which is the complement of critical angle $\theta_c$ for the material of this device. Only one of them, ray 1357e, is reflected by TIR. All the rest, refractively transmitted rays 1357r, constitute leakage and a partial device-failure. More complete ray traces show that 100% delivery is only obtained when the ray incidence angles are less than or equal to the angle between the line connecting points F1 and P4, and the normal to entrance aperture in FIG. 7A. In the example of FIG. 7A this angle is approximately 3 degrees. Some rays with incidence angles greater than 3 degrees for this device will leak out the side of the optic. If all the light is to be redirected by means of total internal reflection, it should be clear that the devices described in Fein, as illustrated by his FIG. 3B, are only suitable for rotating highly collimated light sources.

Figure 7C:
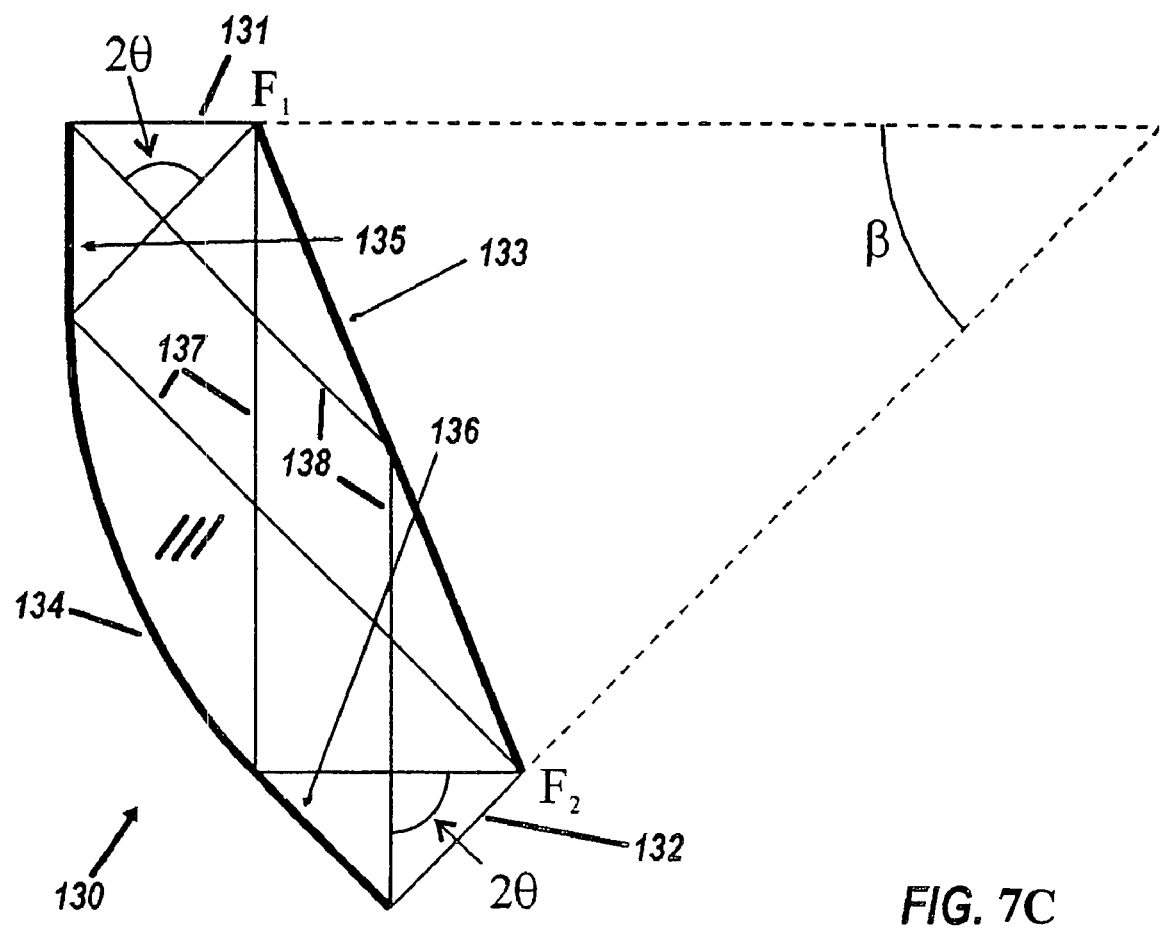
FIG. 7C is a cross-section of an angle-rotator of the optical manifold.

The angle-rotators used in the optical manifold satisfy total internal reflection for all rays up to the highest possible NA. FIG. 7C is a cross-sectional view of an angle-rotator 130, with a first port 131 and a second port 132, which are in complete exchange for light of angular width 2θ. This angle is twice the complement of the critical angle for the transparent material of rotator 130. The second port 132 is at angle β from the plane of port 131, generally at the convenient value of approximately 45°, enabling two angle rotators to transport luminance around a right-angle bend with substantially no losses, a situation that would cause inescapable losses for the simple round or square cross-sections of the prior art.

In FIG. 7C, a flat sidewall 133 extends between foci $F_1$ and $F_2$ of elliptical segment 134, which is in turn flanked by flat sidewalls 135 and 136. Sidewall 135 is oriented perpendicular to entrance aperture 131, while sidewall 136 is oriented perpendicular to exit aperture 132. Rays 137 run from focus $F_1$ to focus $F_2$ via a single total internal reflection, while ray 138 runs via a single total internal reflection from the opposite side of port 131 from point $F_1$ to the opposite side of port 132 from point $F_2$. This shows how angle rotator 130 transfers all rays within ±θ from first port 131 to second port 132, with none escaping. This nonimaging optical configuration tends to smear out any luminance non-uniformities it receives. This smearing is because each point on the second port 132 receives light from the entirety of port 131 as well as from reflections from the walls of angle rotator 130. Since an image is just another type of luminance-nonuniformity, this is why this and other embodiments herein are termed 'non-imaging'.

Figure 7D:
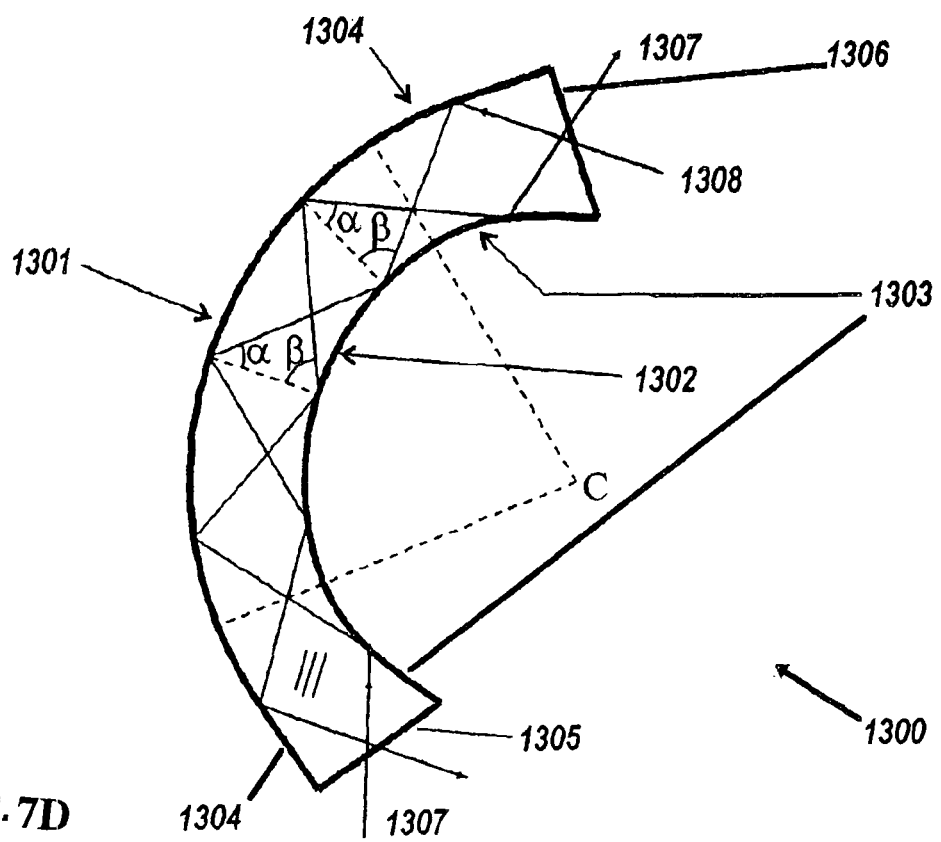
FIG. 7D is an alternative embodiment of an angle-rotator similar to that in FIG. 7C.

FIG. 7D is a cross-sectional view of an angle-rotator 1300 similar to that in FIG. 7C, comprising outer arc 1301 with center of curvature at point C and inner arc 1302 also centered on point C. Tailored curves 1303 terminate both ends of arc 1302, as do tailored curves 1304 for arc 1301. Curves 1303 and 1304 jointly define end ports 1305 and 1306. Their two-way nature is shown by oppositely directed rays 1307 and 1308, totally internally reflecting at outer incidence angle α and inner angle β, respectively against arcs 1301 and 1302. The end-ports are not shown refracting the rays since they are expected to be joined to other optical manifolds such as disclosed herein.

Figure 7E:
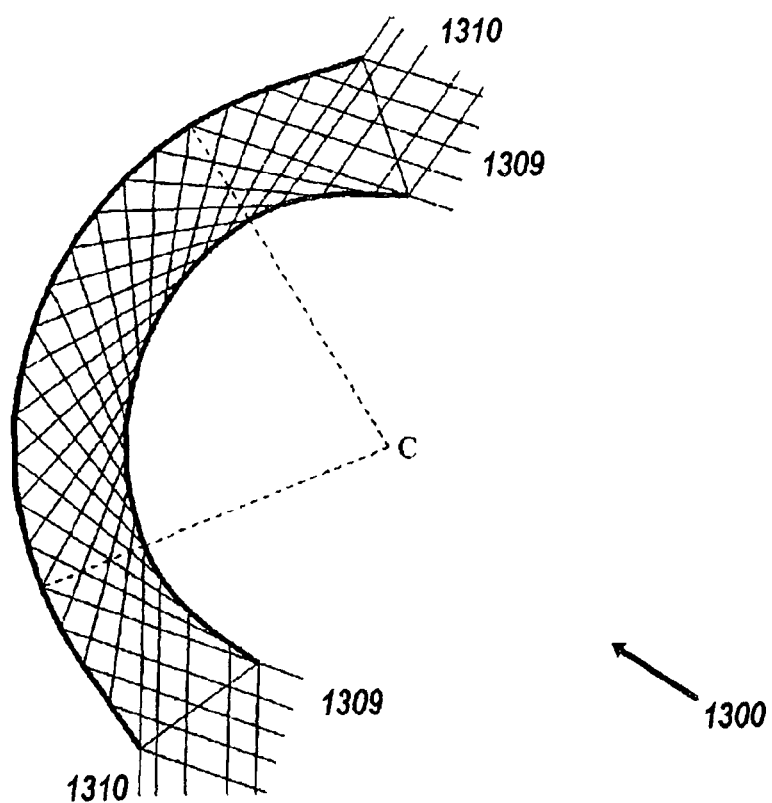
FIG. 7E is a ray tracing of an angle-rotator such as shown in FIG. 7D.

FIG. 7E also shows an angle-rotator 1300, but with complete sets 1309 and 1310 of parallel paths of edge-rays, which define the angular limits within which rotator 1300 will convey all luminosity through large arcs via total internal reflection.

Figure 8:
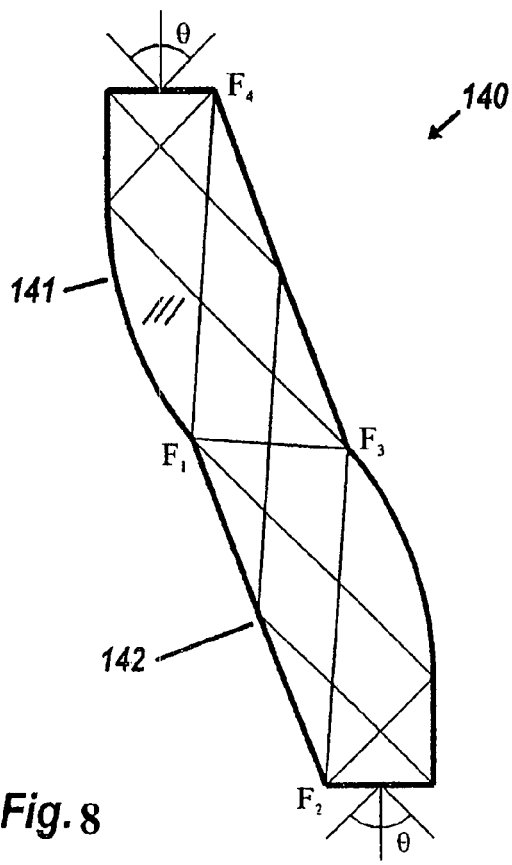
FIG. 8 is a cross-section of a source-shifter comprising two modified angle rotators.

FIG. 8 is a cross-section of an optical shifter 140, comprising first angle rotator 141 and oppositely oriented second angle rotator 142. To fit together, both rotators have been modified by removal of segments analogous to flat segment 135 of FIG. 7C. Thus interface $F_1$-$F_3$ is wider than the input light. The net effect of shifter 140 is, in this example, a lateral shift of 1.5 widths of an input luminance distribution, which of course is confined to the critical angle of the transparent material composing it. The multiple internal reflections within shifter 140 tend to smooth out any luminance non-uniformities entering it.

Figure 9A:
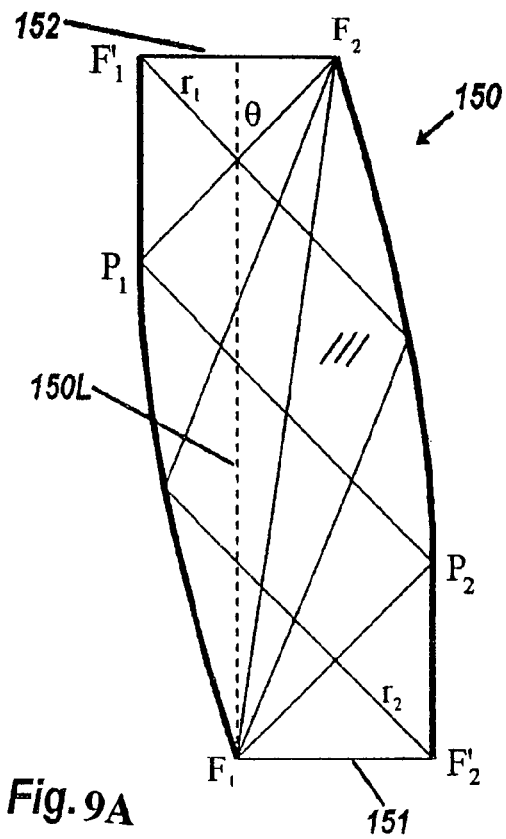
FIG. 9A is a cross-section of a half-width source shifter.

FIG. 9A is a cross-section of optical shifter 150, also for lateral luminance shifting with no angle rotation. First port 151 spans points $F_1'$ and $F_2$. Second port 152 spans points $F_1$ and $F_2'$ and is shifted a half width from port 151, as shown by dotted line 150L. When either port is a boundary with air, light entering it must be within the critical angle θ of the transparent material of 150. Straight-line segment $F_1'P_1$ is perpendicular to port 152, and straight-line segment $F_2'P_2$ is perpendicular to port 151. Parabola $F_1P_1$ has focus at $F_2$ and axis parallel to ray $r_1$. Parabola $F_2P_2$ has focus at $F_1$ and axis parallel to ray $r_2$, which is parallel to ray $r_1$. As a non-imaging optical device, element 150 tends to smear out, as previously discussed regarding FIG. 7C, non-uniformities of the luminance distributions entering it.

Figure 9B:
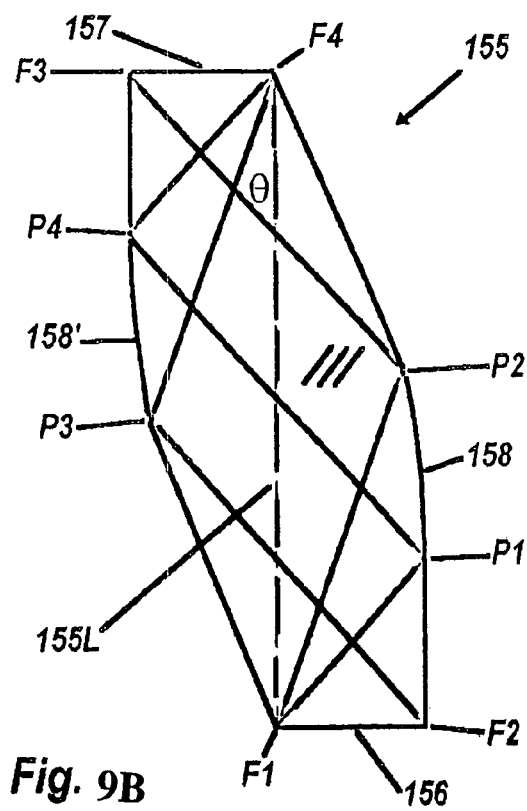
FIG. 9B is a cross-section of a full-width source shifter.

FIG. 9B is a cross-section of optical shifter 155, for lateral luminance shifting by its full width, as shown by line 155L. A first port 156 spans from point F1 to point F2. A second port 157 spans from point F3 to point F4. As previously, light is confined to the critical angle .theta. of the transparent material composing shifter 155. This is shown in the FIG. 15B as the acute angle formed between the line defined by the ray from points F3 to P2 and the axis 155L. Most of the perimeter of shifter 155 is straight lines, from point F4 to Point P2, from point F2 to point P1, from point F1 to point P3, and from point F3 to point P4. Parabolic segment 158 runs from point P1 to point P2, and has its focus at point F1 and its axis parallel to ray F2-P3. Parabolic segment 158' runs from point P3 to point P4, and has its focus at point F4 and its axis parallel to ray F3-P2.

FIGS. 9A and 9B show two variations along a continuum of possible values of lateral shift of luminance. Greater shifts merely require a longer shifter than 155 of FIG. 9B.

Another advantage of various of the optical manifolds described herein is their ability to alter not only the limiting angle of light entering the manifold, but also the spatial shape of the luminance entering it, particularly from square to rectangular. The luminance shifters of FIGS. 9A and 9B can be adapted for this purpose, enabling elongated luminance distributions to be produced.

Figure 10:
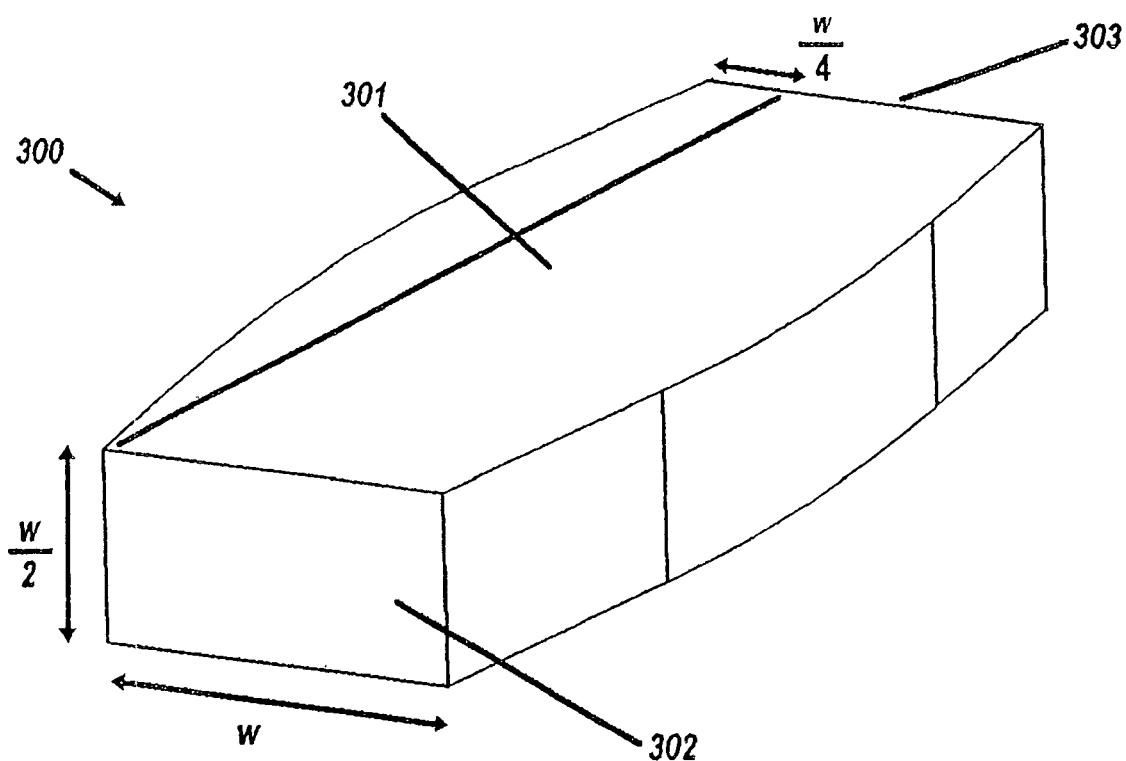
FIG. 10 is a perspective view of a luminance shifter.

FIG. 10 is a perspective view of a luminance shifter 300, formed from profile 301 of width w (at port 302), by an orthogonal sweep by w/2, so that first port 302 is a 2:1 rectangle. Second port 303 is shifted by w/4, rather than the w/2 shown in FIG. 9A.

Figure 11A:
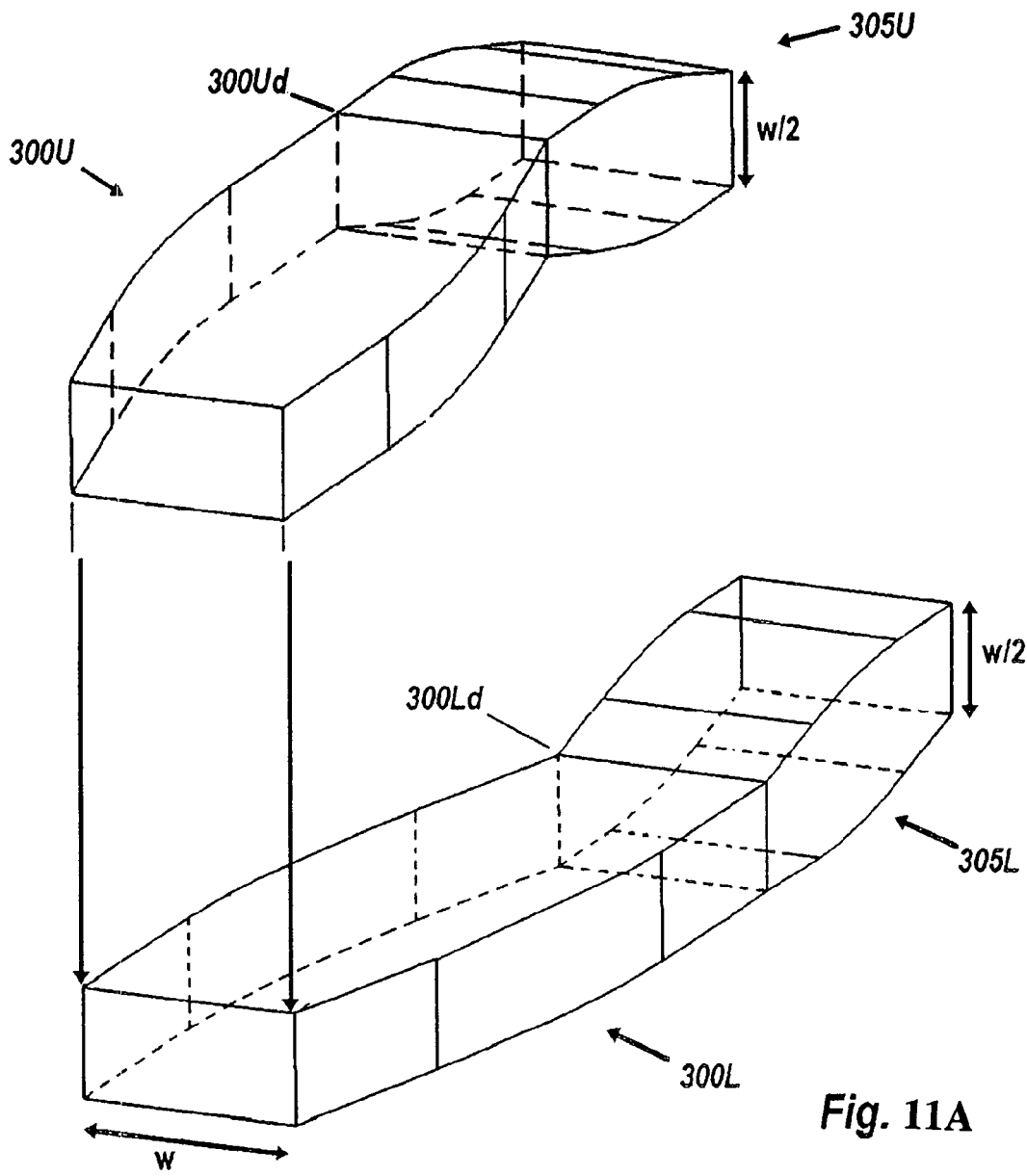
FIG. 11A is an exploded, perspective view of another embodiment of an optical manifold that defines a monolithic etendue-squeezer.

FIG. 11A is an exploded, perspective view of another embodiment. Upper half-width shifter 300U is contiguous across line 300Ud with orthogonal shifter 305U, with downward shift of w/4. Nearly identical but inverted lower shifter 300L is contiguous with shifter 305L, to provide a side shift of w/2 and an upward shift w/4.

Figure 11B:
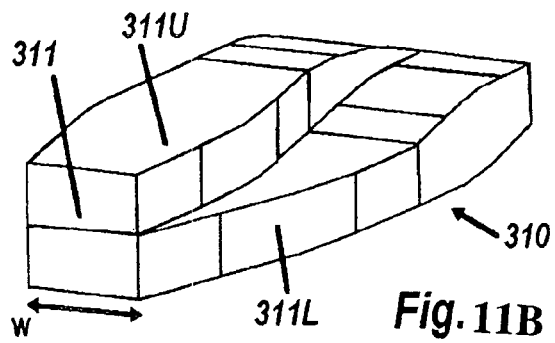
FIG. 11B is a perspective view of the resulting monolithic etendue-squeezer shown in exploded view in FIG. 11A.

FIG. 11B is a perspective view of the monolithic etendue-squeezer 310 shown in exploded view in FIG. 11A. In FIG. 11B, a square input face 311 is split into a top duct 311U and a lower duct 311L, also diverging to form a 4:1 rectangular output face (not shown). As previously, this device operates on light within the critical angle of its transparent material.

Figure 11C:
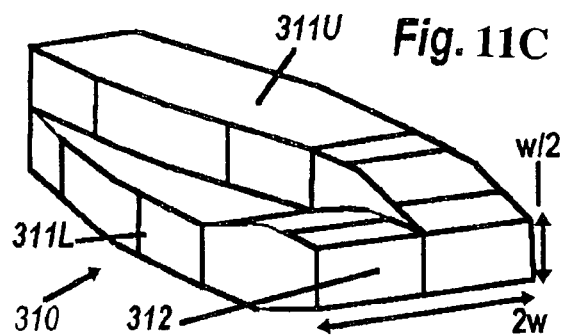
FIG. 11C is another perspective view of the monolithic etendue-squeezer shown in FIGS. 11A and 11B.

FIG. 11C is another perspective view of the etendue-squeezer 310 shown in FIG. 11B, showing a 4:1 rectangular output face 312, and also showing its width 2w and height w/2.

FIG. 12 is a perspective view of a monolithic 9:1 etendue-squeezer 320, comprising: an upper-to-left light-duct 321, a central rectangular duct 322, and a lower-to-right light-duct 323. These light-ducts divide square-face port 324 into three parts, each having a 3:1 ratio, which are displaced and rejoined as 9:1 elongated rectangular duct 325. The shape of rectangle 325 can be useful both as a fan-out for nine small light-ducts or as a synthetic light source for luminaries, particularly when phosphor-coated.

A practical issue with many embodiments of the optical manifold described herein is where to put attachment points for mounting a manifold in its proper position. When a surface is optically active, placing a mounting fixture thereupon will result in optical losses through diversion of light from its intended destination. Accordingly, it is often desirable to arrange for some optically inactive surfaces to be part of a manifold.

Figure 13B:
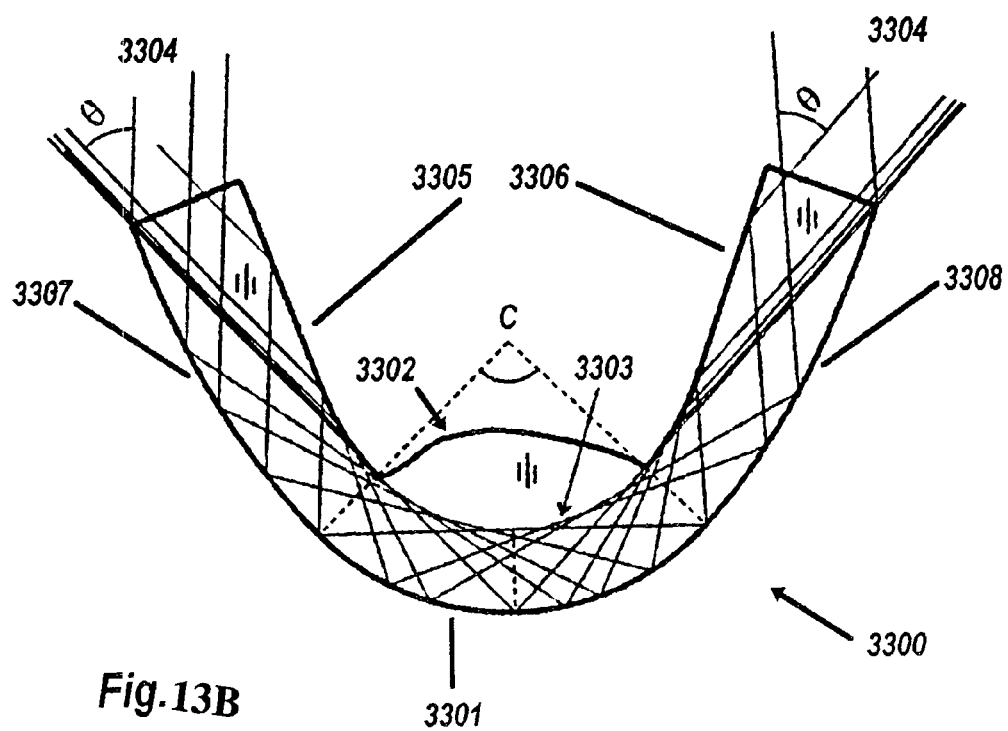
FIG. 13B is a cross-section of an angle-rotating luminance duct similar to the embodiment of FIG. 13A.

FIG. 13A is a cross-sectional view of a light duct 330 having an input port 331 and an output port 332, with limiting incidence angle θ upon both. The bottom side of duct 330 comprises flat mirror 333 perpendicular to face 332, elliptical arc E45 with foci at points F4 and F5, elliptical arc E24 with foci at points F2 and F4, parabolic arc P21 with focus at point F2 and axis parallel to line r1, elliptical arc E23 with foci at points F2 and F3, and parabolic arc P22 with focus at point F2 with axis parallel to line r2. The upper surface of duct 330 comprises parabolic arc P53 with focus at point F5 and axis parallel to line r3, inactive surface 334, parabolic arc P11 with focus at point F1 and axis parallel to line r1, and flat mirror 335. It can be seen that no light touches surface 334, in that the line joining points F2 and F4 represents an extreme ray.

FIG. 13E, is a cross-sectional view of an angle-rotating luminance duct 3300, resembling that of FIG. 7D, with a full 90° circular-arc outer profile 3301, but without a corresponding inner circular arc. Instead, inactive optical profile 3302 lies inside arcuate caustic 3303 formed by ray-paths 3304, propagating within 3300 with directions spanning total angle Θ. End-sections 3305 through 3308 are shaped to cause the formation of caustic 3303, dispensing with any active inner wall.

Figure 14:
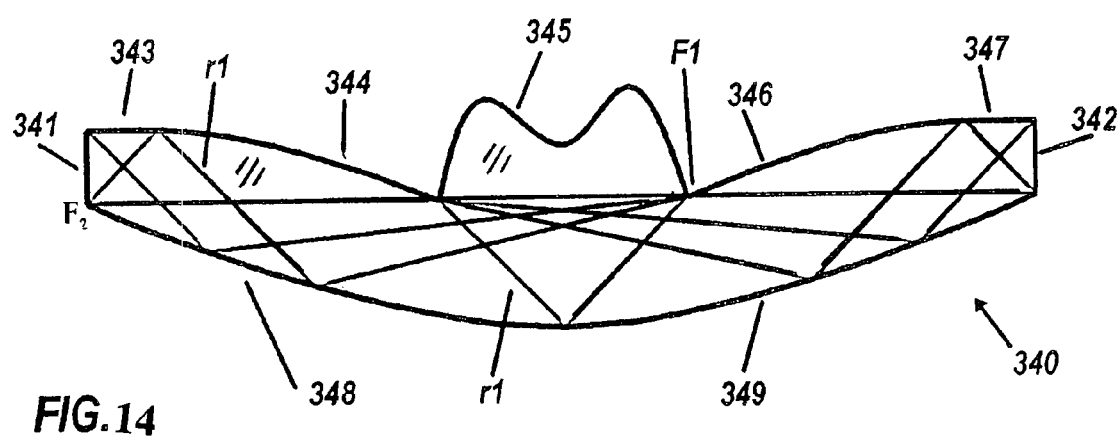
FIG. 14 is a cross-section of an angle-rotating luminance duct that has symmetrically placed ports.

FIG. 14 is a cross-sectional view of a light duct 340, which has symmetrically placed ports 341 and 342. Its upper surface comprises on the left flat mirror segment 343 and parabolic arc 344 having focus at F2 and axis parallel to line r1. At upper center is optically inactive surface 345. On the upper right are corresponding parabolic arc 346 and flat mirror 347. The lower surface comprises parabolic arc 348 with focus at F1 and axis parallel to line r1, and its mirror image arc 349.

Figure 15:
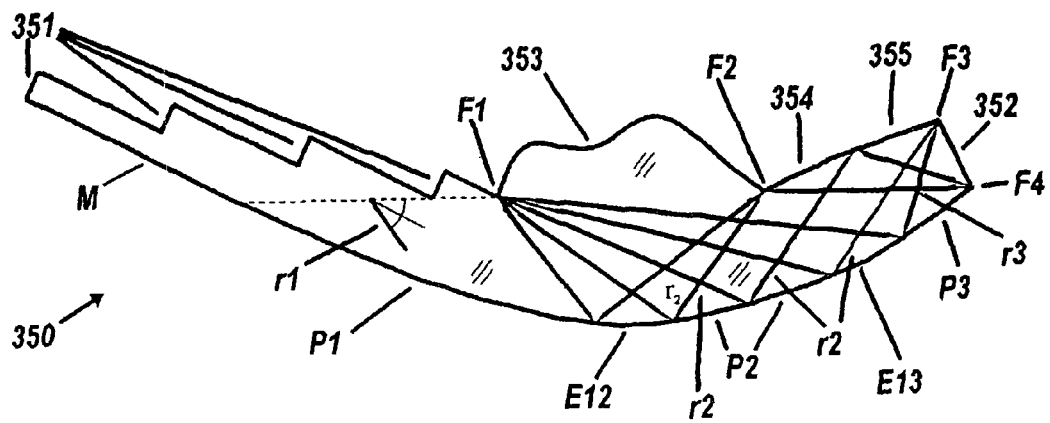
FIG. 15 is a cross-section of a 4:1 duct with an inactive surface.

FIG. 15 is a cross-sectional view of a light duct 350 that has plurality of input ports 351 and an exit port 352. A central optically inactive surface 353 is flanked by a parabolic segment 354 that defines a focus at F4 with an axis parallel to line r2, and by flat mirror 355. The bottom surface of light duct 350 comprises a flat mirror M, a parabolic arc P1 with focus at F2 and an axis parallel to line r1; an elliptical arc E12 with foci F1 and F2, a parabolic arc P2 with focus at F1 and an axis parallel to line r2, an elliptical arc E13 with foci at F1 and F3, and a parabolic arc P3 with focus at F1 and an axis parallel to line r3.

Figure 16:
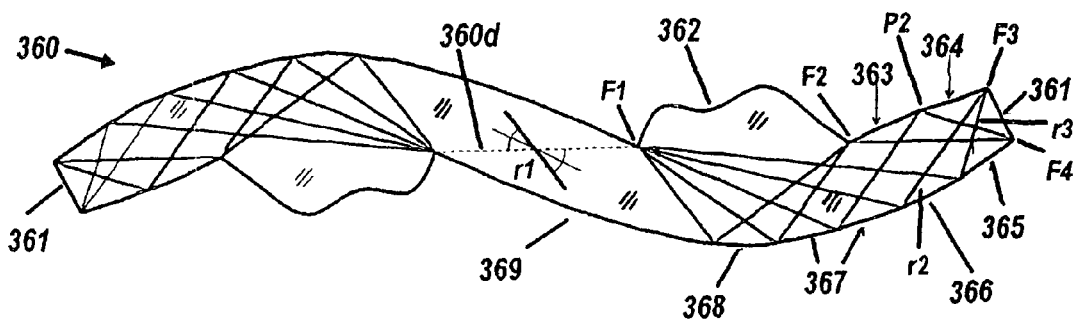
FIG. 16 is a cross-sectional view of a bilaterally symmetrical duct with two inactive surfaces.

FIG. 16 is a cross-sectional view of a luminance duct 360, having a configuration that is bilaterally symmetrical about dotted line 360d, and having ports 361. Also shown are an optically inactive surface 362, a parabolic arc 363 with focus at F4 and axis parallel to line r2, a flat mirror 364, a parabolic arc 365 with focus at F1 and an axis parallel to line r3, an elliptical arc 366 with foci at F1 and F3, a parabolic arc 367 with focus at F1 and an axis parallel to line r2, an elliptical arc 368 with foci at F1 and F2, and a parabolic arc 369 with focus at F2 and an axis parallel to line r1.

Figure 17A:
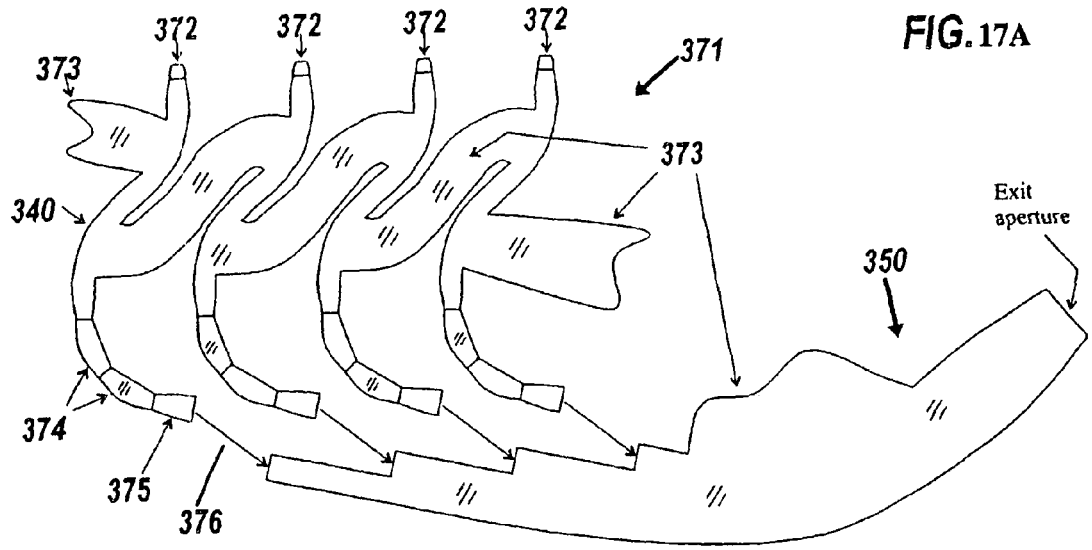
FIG. 17A is a cross-sectional view of a composite system comprising four joined ducts with the configuration of FIG. 15.

FIG. 17A is a cross-sectional view of an extended optical manifold comprising system 350 of FIG. 15, and a four-part manifold 371 fed by four LEDs 372. The optical manifold 371 comprises the four sections 360 of FIG. 16, as well as angle rotators 374 and angle transformer 375, which are shown joining to duct 350 by arrows 376. Optically inactive surfaces 373 are available for mounting as well as for the location of injection gates and ejector pins in injection molding.

Figure 17B:
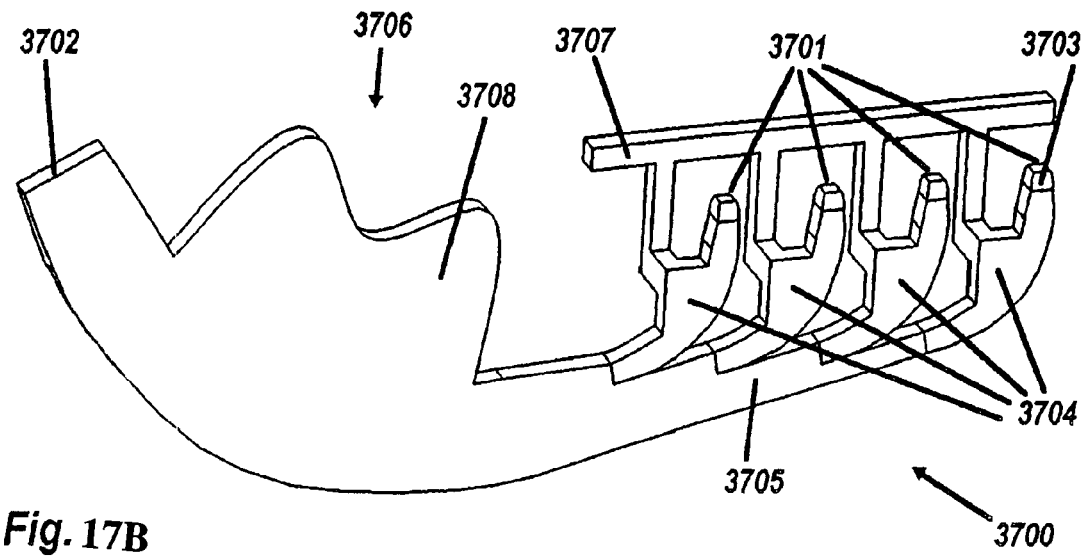
FIG. 17B is a cross-sectional view of another embodiment of an optical manifold in a further composite system.

FIG. 17B is a perspective view of another embodiment of an optical manifold. The optical manifold 3700 in FIG. 17B combines elements of previous Figures. In FIG. 17B, an optical manifold 3700 comprises four input ports 3701 (each with CPC 3703) and a single output 3702 having only their combined etendue, so that all light entering the input ports will be conveyed out the exit port. Each input port 3701 feeds one of the angle-rotators 3704, identical in profile to the embodiment of FIG. 13A. The rotators feed combiner 3705, which is identical to that of FIG. 22, and which in turn connects with large rotator 3706. A structural beam 3707 connects with the optically inactive flanges of rotators 3704, providing secure mounting in a different plane than that of flange 3708.

Figure 17C:
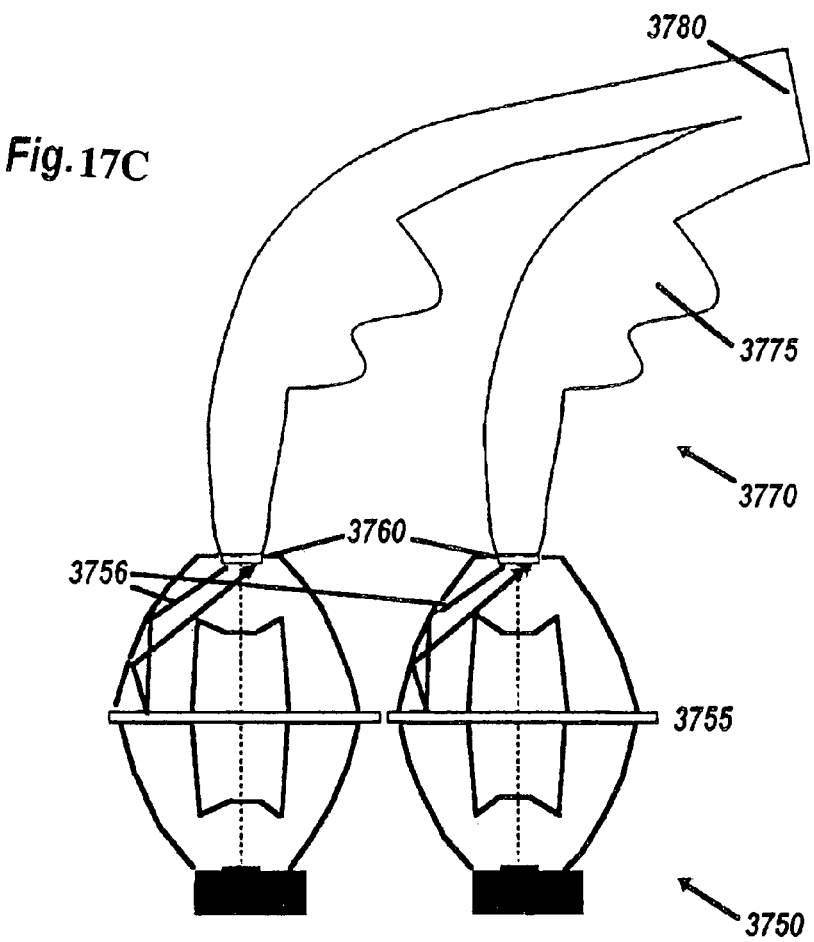
FIG. 17C is a cross-sectional view of another embodiment of an optical manifold in a composite system, also including a phosphor-coated surface.

FIG. 17C is a cross-sectional view of yet a further combination, showing two individual dual-lens LEDs with remote phosphors 3750 including blue-pass dichroic filters 3755, seen to be recycling rays 3756 of phosphor back emission. Each phosphor feeds angle rotator 3770, their luminosity combined at output port 3780. Brackets 3775 provide sturdy support so that phosphors 3760 receive no structural loads.

Figure 18A:
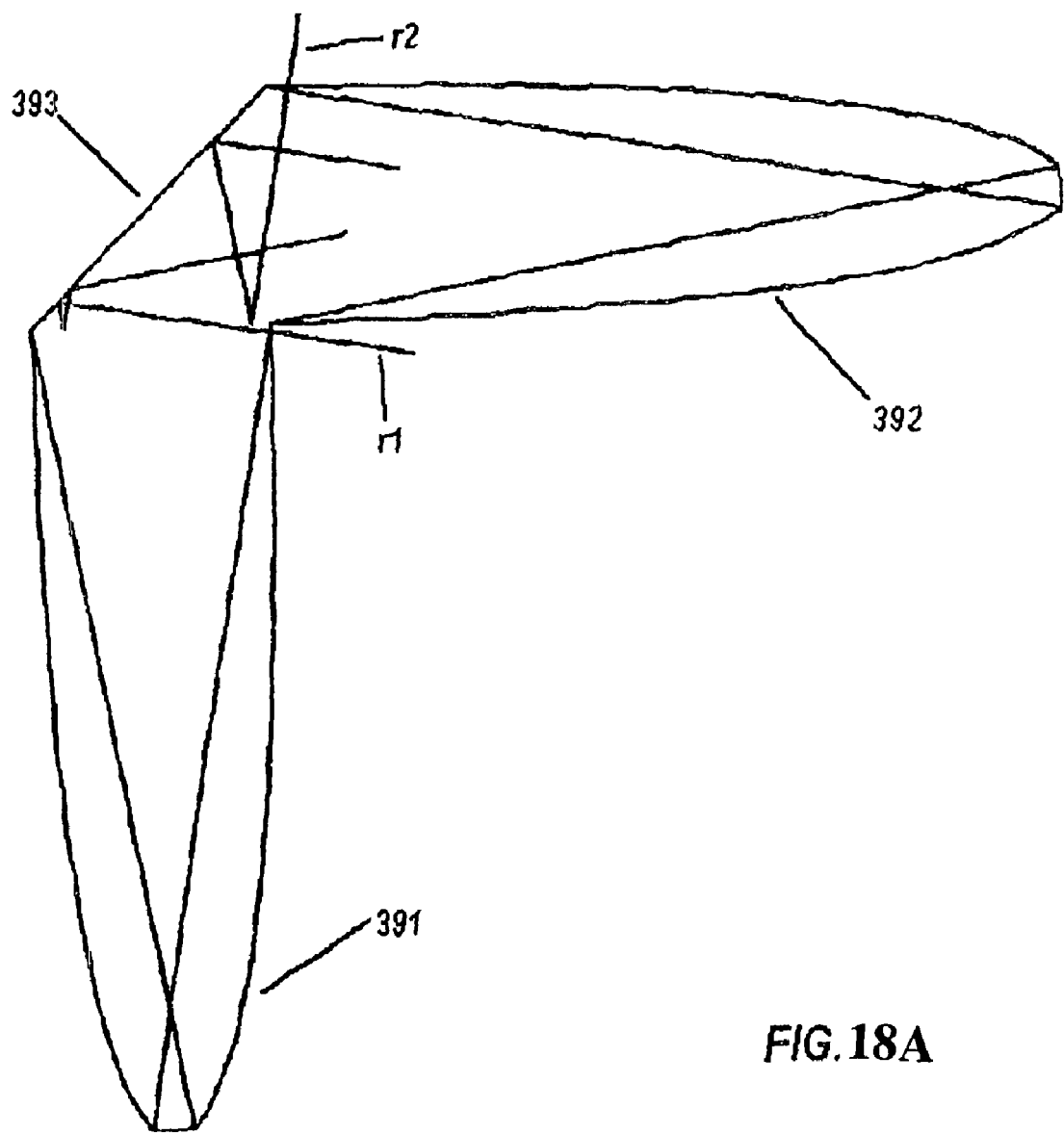
FIG. 18A is a cross-sectional view of an alternative optical manifold that includes dielectric CPCs, illustrating the drawbacks of joining two CPCs at 90°.
Figure 18B:
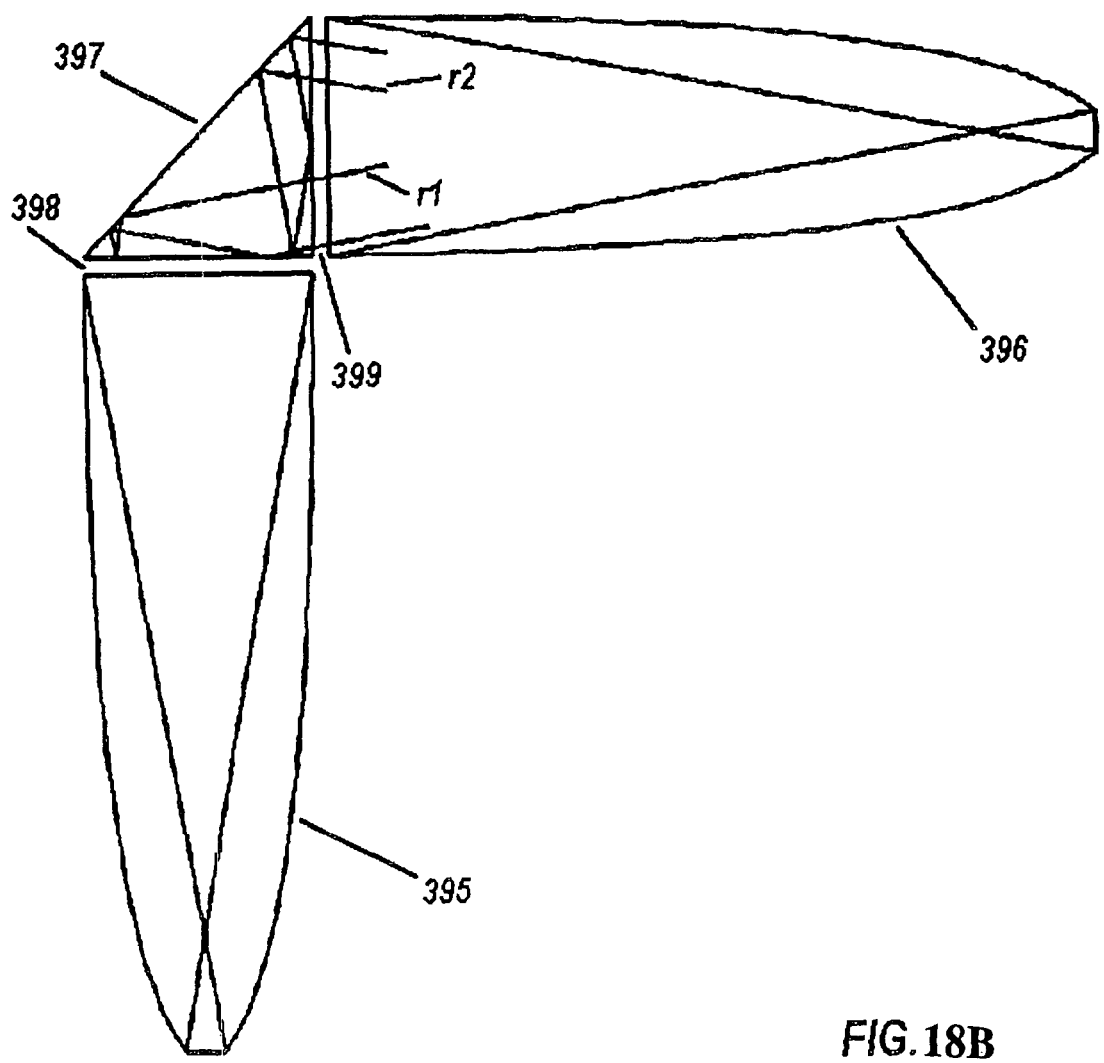
FIG. 18B is a cross-sectional view of an alternative optical manifold that includes two dielectric CPCs as in FIG. 18A, illustrating how an air gap prevents rays from escaping.

FIGS. 18A and 18B are cross-sectional views of an alternative arrangement that includes dielectric CPCs. When a 90° turn is desired, the configuration of FIG. 18A shows why such a prism coupler may be necessary or useful. Dielectric CPCs 391 and 392 have orthogonal orientations, joining at diagonal 393. Escaping rays r1 and r2 are exemplary of the optical losses incurred in this configuration. FIG. 18B shows separate dielectric CPCs 395 and 396, coupled by diagonal prism 397 situated with air gaps 398 and 399. Ray r1 has been internally reflected by gap 398 and thus remains within CPC 396. Similarly, ray r2 has been internally reflected by gap 399, onto the diagonal of 397 to be reflected therefrom into CPC 396.

The method shown and discussed with reference to FIG. 5 of recycling phosphor back-emission utilizes a blue-pass filter that returns this back-emission to the phosphor. This method utilizes low absorption in the phosphor. The configuration of FIG. 19 can be utilized for a phosphor that does have significant absorption of its own emission wavelengths. Dielectric CPC 411 has blue LED 412 coupled to it, with its directed output shown as edge rays. This blue light passes unimpeded through diagonal blue-pass filter 413 and proceeds into dielectric CPC 415 to illuminate phosphor patch 416. Phosphor back emission proceeds to filter 413 and is reflected into third dielectric CPC 417, which has exit face 418. An expanded section shows how flat section 417f acts to restrict incidence angles to less than the critical angle $\alpha_c$, given by $\alpha_c = \sin^{-1}(1/n)$ for refractive index n of the dielectric material comprising CPC 417.

The CPC 411 has a diagonal exit face 413 with the blue-pass filter coated thereupon. Optically joined to face 413 is a diagonal prism 414. Adjacent to the prism 414 is the dielectric CPC 415, having the phosphor patch 416 on its exit face. Phosphor back-emission proceeds through prism 414, reflects off diagonal exit face 413 into dielectric CPC 417. This reflected back-emission forms a virtual source 418 at the exit face of CPC 417. An expanded view shows how flat section 417f acts to restrict incidence angles on face 418 to the critical angle $\alpha_c$.

The description herein describes both individual optical elements and several embodiments that combine them as building blocks. One common theme of many of these elements and their combinations is preservation of source luminance through etendue preservation, using novel applications of the principles of non-imaging optics.

The preceding description of the presently contemplated best mode of practicing the optical transformer described herein is not to be taken in a limiting sense, but is made merely for the purpose of describing the general principles of the invention. The scope of the invention should be determined by reference to the claims.

It will be appreciated by those skilled in the art, in view of these teachings, that alternative embodiments may be implemented without deviating from the spirit or scope of the invention. This invention is to be limited only by the following claims, which include all such embodiments and modifications when viewed in conjunction with the above specification and accompanying drawings.

What is claimed is:

1. An optical device, comprising:
   at least one transparent body comprising a first transparent body component and a second transparent body component, said transparent body defining an outer surface, at least one entry port, and at least one exit port, said at least one transparent body comprising a material suitable for propagating light, said material having an index of refraction suitable for providing total internal reflection at the surface of said body;
   said outer surface comprising optically active surfaces angled for total internal reflection of light issuing into and out of said entry and exit ports;
   said entry and exit ports operable for light-transmittance at substantially all incidence angles up to the critical angle of said material;
   said optically active surfaces operable as connecting surfaces between said entry and exit ports; said connecting surfaces operable for conveying light by total internal reflection at all incidence angles past the critical angle of said transparent material;
   said connecting surfaces comprising non-imaging configurations that spatially mix said light;
   said first transparent body component having a reflective surface angled to reflect light passing from at least one said entry port to at least one said exit port by internal reflection, and having at least one transmissive face for transmitting light to or from said second transparent body component;
   said first and second transparent body components being separated by at least one gap of lower refractive index so that light within said first component striking said transmissive face at high angles of incidence is totally reflected within said first component.

2. The optical device according to claim 1, wherein said first component is a prism, wherein said at least one transmissive face comprises an inlet face and an outlet face of the prism, said at least one second component comprises a component for bringing light from at least one said entry port to the reflective face of the prism via the inlet face and a component for bringing light from the reflective face of the prism to at least one said exit port to the via the outlet face, and rays of light that meet the outlet face at high angles of incidence in passing from said inlet face to said reflective surface and rays of light that meet the inlet face at high angles of incidence in passing from said reflective surface to said outlet face are reflected at said at least one gap.

3. The system of claim 1, wherein at least one said gap is an air gap.

4. The optical manifold of claim 1, further comprising a flat LED with a diffuse reflector internal to the LED on one major flat face of the flat LED, wherein the LED emits light through its other major flat face opposite to said one major flat face with the diffuse reflector.

5. The optical manifold of claim 4, wherein the diffuse reflector comprises a diffuse silver coating.

6. An optical manifold for distributing light, comprising:
a transparent body defining an outer surface, at least one entry port, and at least one exit port, said transparent body comprising a material suitable for propagating light, said material having an index of refraction suitable for providing total internal reflection at the surface of said body;
said outer surface comprising optically active surfaces angled for total internal reflection of light issuing into and out of said entry and exit ports;
said entry and exit ports operable for light-transmittance at substantially all incidence angles up to the critical angle of said material;
said entry and exit ports having generally rectangular shapes of substantially the same area but different proportions;
said optically active surfaces operable as connecting surfaces for conveying light between said entry and exit ports by total internal reflection at all incidence angles past the critical angle of said transparent material; and
said connecting surfaces comprising two opposite planar surfaces and two opposite surfaces with linearly swept nonimaging profiles that spatially mix said light.

7. The optical manifold of claim 6, wherein the entry and exit ports have areas X by nY and nX by Y, for positive integer n, and said manifold comprises n contiguous luminance shifters connecting a respective X by Y area of the input port to a respective X by Y area of the output port.

8. The optical manifold of claim 7, comprising first luminance shifters connecting the X by nY port to cross-sections separated in both X and Y directions, and second luminance shifters connecting said separated cross-sections to the nX by Y port.

9. The optical manifold of claim 8, wherein one of said separated cross-sections is connected by a straight light pipe to a respective portion of at least one of the ports.

10. An optical beam rotator, comprising:
a transparent body defining an outer surface with opposite first and second sides, and non-parallel entry and exit ports extending between the first and second sides;
the first side comprising a first optically active surface extending from said first port to a first point and a second point, wherein the first point is between the first port and the second point;
the second side comprising a second optically active surface;
the first and second points positioned so that light entering through the first port and passing without reflection the first point does not pass between the first and second points;
the second optically active surface shaped so that light entering the first port and reflecting off the second optically active surface does not pass between the first and second points; and
the first and second optically active surfaces comprising elliptical and parabolic arcs with foci at the first and second points such that light entering the first port and reflecting off the first optically active surface and then off the second optically active surface does not pass between the first and second points; and
an optically inactive part of the body, the inactive part positioned between the first and second points projecting away from the second optically active surface.

11. The optical beam rotator of claim 10, further comprising a third optically active surface extending from the second intermediate point away from the first port and towards the second port.

12. The optical beam rotator of claim 10, wherein at least one of the first and second ports communicates with a further optical device integral with the optical beam rotator.

13. The optical beam rotator of claim 10, wherein the optically inactive part of the body further comprises a mounting for the body, the mounting located outside the path of light between the first and second points.

14. The optical beam rotator of claim 10, wherein the second optically active surface further comprises a portion extending from the first port in the shape of an ellipse, the foci of the ellipse being the second point and a point where the first port meets the first optically active surface.

15. The optical beam rotator of claim 10, wherein the second optically active surface further comprises a portion extending from the first port in the shape of an ellipse, the foci of the ellipse being the first point and a point where the second port meets the third optically active surface.

* * * * *